(12) United States Patent
Robl et al.

(10) Patent No.: US 10,648,096 B2
(45) Date of Patent: May 12, 2020

(54) ELECTROLYTE, METHOD OF FORMING A COPPER LAYER AND METHOD OF FORMING A CHIP

(71) Applicant: Infineon Technologies AG, Neubiberg (DE)

(72) Inventors: Werner Robl, Regensburg (DE); Michael Melzl, Neutraubling (DE); Manfred Schneegans, Vaterstetten (DE); Bernhard Weidgans, Bernhardswald (DE); Franziska Haering, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 364 days.

(21) Appl. No.: 14/948,463

(22) Filed: Nov. 23, 2015

(65) Prior Publication Data

US 2016/0168739 A1 Jun. 16, 2016

Related U.S. Application Data

(63) Continuation-in-part of application No. 14/568,163, filed on Dec. 12, 2014, now abandoned.

(51) Int. Cl.
*C25D 5/50* (2006.01)
*C25D 17/12* (2006.01)
(Continued)

(52) U.S. Cl.
CPC .............. *C25D 3/38* (2013.01); *C25D 3/12* (2013.01); *C25D 3/32* (2013.01); *C25D 3/46* (2013.01);
(Continued)

(58) Field of Classification Search
CPC ................................. C25D 5/50; C25D 3/38
(Continued)

(56) References Cited

U.S. PATENT DOCUMENTS 2,250,556 A 7/1941 Stareck
3,201,282 A 8/1965 Justi et al.
(Continued)

FOREIGN PATENT DOCUMENTS

CH 381290 A 8/1964
CN 1248300 A 3/2000
(Continued)

OTHER PUBLICATIONS

Machine translation of CN103046088 of Tang et al. (Year: 2013).*
(Continued)

*Primary Examiner* — Brian W Cohen
(74) *Attorney, Agent, or Firm* — Viering, Jentschura & Partner MBB

(57) ABSTRACT

An electrolyte may be provided. The electrolyte may include at least one additive configured to decompose or evaporate at a temperature above approximately 100° C., and a water soluble metal salt, and the electrolyte may be free from carbon nanotubes. In various embodiments, a method of forming a metal layer may be provided: The method may include depositing a metal layer on a carrier using an electrolyte, wherein the electrolyte may include at least one additive configured to decompose or evaporate at a temperature above approximately 100° C. and a water soluble metal salt, wherein the electrolyte is free from carbon nanotubes; and annealing the metal layer to form a metal layer comprising a plurality of pores. In various embodiments, a semiconductor device may be provided. The semiconductor device may include a metal layer including a plurality of pores, wherein the plurality of pores may be (Continued)

formed in the metal layer as remnants of an additive having resided in the plurality of pores and having at least partially decomposed or evaporated. To keep a high elasticity over a wide temperature range (up to 450° C.), an adhesion layer may stabilize the metal grain boundaries and may fix dislocation gliding inside metal grains. In various embodiments, a metal layer is provided. The metal layer may include a plurality of pores having ellipsoidal or spheroidal shape.

20 Claims, 12 Drawing Sheets

(51) Int. Cl.
    *C25D 3/38*     (2006.01)
    *C25D 3/48*     (2006.01)
    *C25D 3/46*     (2006.01)
    *C25D 3/12*     (2006.01)
    *C25D 3/52*     (2006.01)
    *C25D 3/32*     (2006.01)
    *C25D 15/00*     (2006.01)
    *C25D 7/12*     (2006.01)
    *H01L 21/288*     (2006.01)
    *H01L 23/532*     (2006.01)

(52) U.S. Cl.
    CPC ............... *C25D 3/48* (2013.01); *C25D 3/52* (2013.01); *C25D 5/50* (2013.01); *C25D 7/123* (2013.01); *C25D 15/00* (2013.01); *H01L 21/2885* (2013.01); *H01L 23/53228* (2013.01); *H01L 2924/0002* (2013.01)

(58) Field of Classification Search
    USPC .................................. 205/112, 224
    See application file for complete search history.

(56) References Cited

U.S. PATENT DOCUMENTS

| | | | |
|---|---|---|---|
| 5,196,232 A * | 3/1993 | Kitazaki | B22F 7/002 427/180 |
| 6,881,448 B1 | 4/2005 | Hattori | |
| 7,332,066 B2 | 2/2008 | Chen et al. | |
| 8,008,712 B2 | 8/2011 | Hille et al. | |
| 2002/0046679 A1 | 4/2002 | Honma et al. | |
| 2010/0126849 A1* | 5/2010 | Lopatin | H01M 4/0438 204/275.1 |
| 2010/0193365 A1 | 8/2010 | Lopatin et al. | |
| 2011/0084369 A1* | 4/2011 | Eder | H01L 21/4867 257/666 |
| 2011/0097628 A1* | 4/2011 | Lopatin | C25D 3/32 429/220 |
| 2011/0259750 A1 | 10/2011 | Hafezi et al. | |
| 2016/0102412 A1* | 4/2016 | Takamizawa | C25D 3/12 205/112 |

FOREIGN PATENT DOCUMENTS

| | | | | |
|---|---|---|---|---|
| CN | 1293719 A | 5/2001 | | |
| CN | 1882719 A | 12/2006 | | |
| CN | 101663753 A | 3/2010 | | |
| CN | 102379050 A | 3/2012 | | |
| CN | 103046088 A | 4/2013 | | |
| DE | 654918 A | 1/1938 | | |
| DE | 60036262 T2 | 5/2008 | | |
| JP | S62180093 A | 8/1987 | | |
| JP | 2012201961 A | 10/2012 | | |
| WO | 9947731 A1 | 9/1999 | | |
| WO | 2005031812 A2 | 4/2005 | | |
| WO | 2005040459 A2 | 5/2005 | | |
| WO | 2008128823 A1 | 10/2008 | | |
| WO | 2010090956 A2 | 8/2010 | | |
| WO | WO-2015060449 A1 * | 4/2015 | ............... | C25D 3/12 |

OTHER PUBLICATIONS

F.I. Lizama-Tzec, L. Canché-Canul, G. Oskam; Electrodeposition of copper into trenches from a citrate plating bath; Electrochimica Acta vol. 56, Issue 25, Oct. 30, 2011, pp. 9391-9396.

Stephen D. Kang, Jung Joon Yoo, Ho-Ki Lyeo, Jae Yong Song, Sunjun Lee, and Jin Yu; Assessing the thermal conductivity of non-uniform thin-films: Nanocrystalline Cu composites incorporating carbon nanotubes; Journal of Applied Physics 110, 023506 (2011); doi: 10.1063/1.3606559.

* cited by examiner

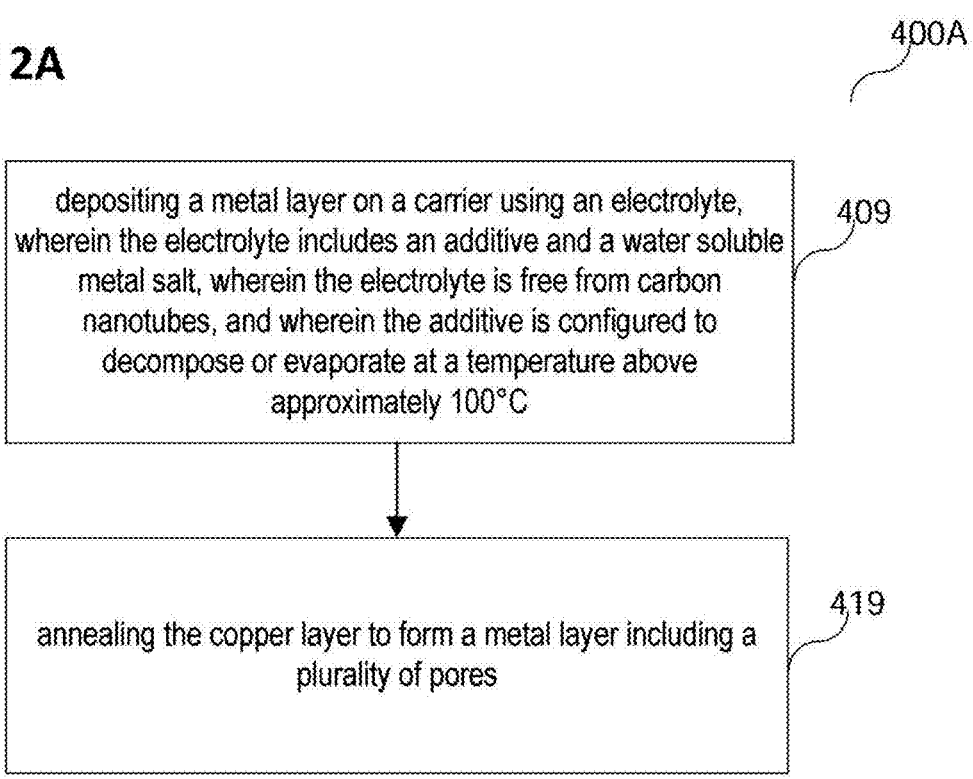

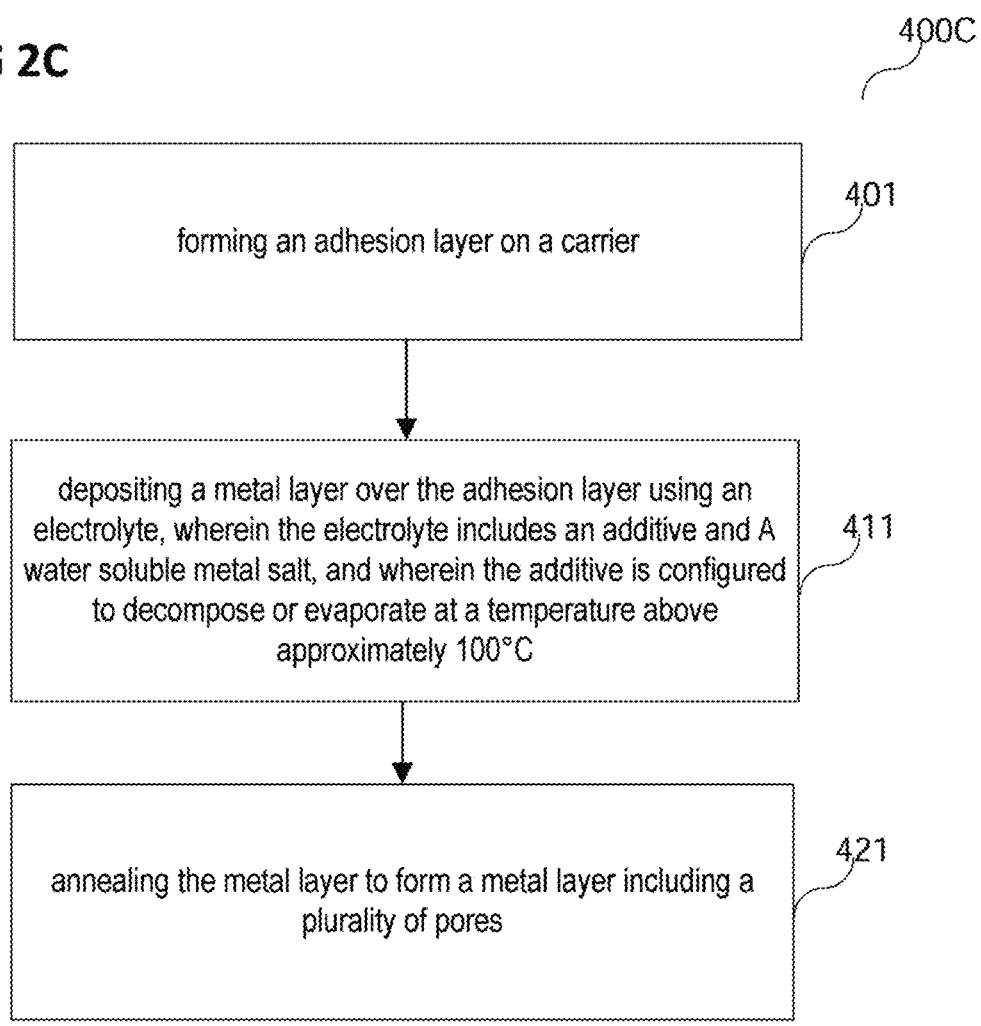

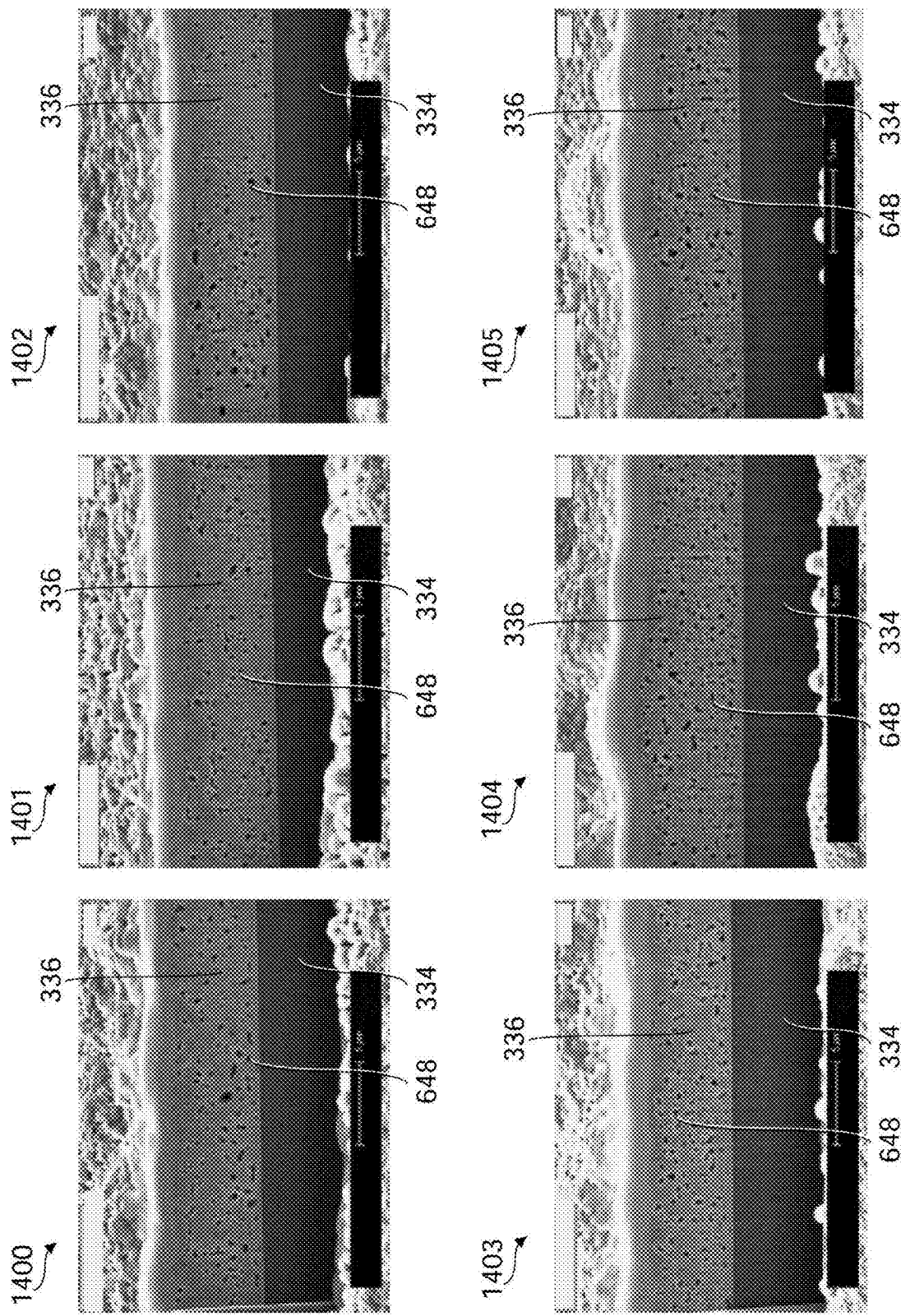

FIG 8A
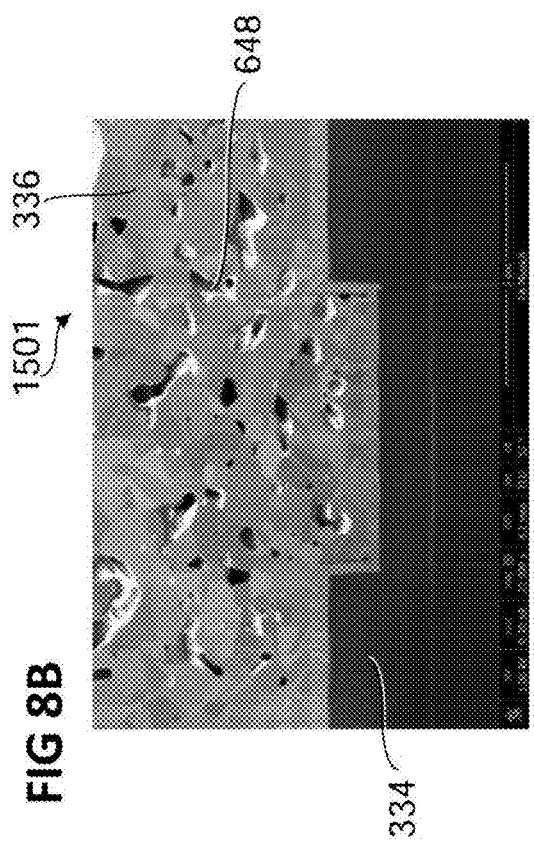
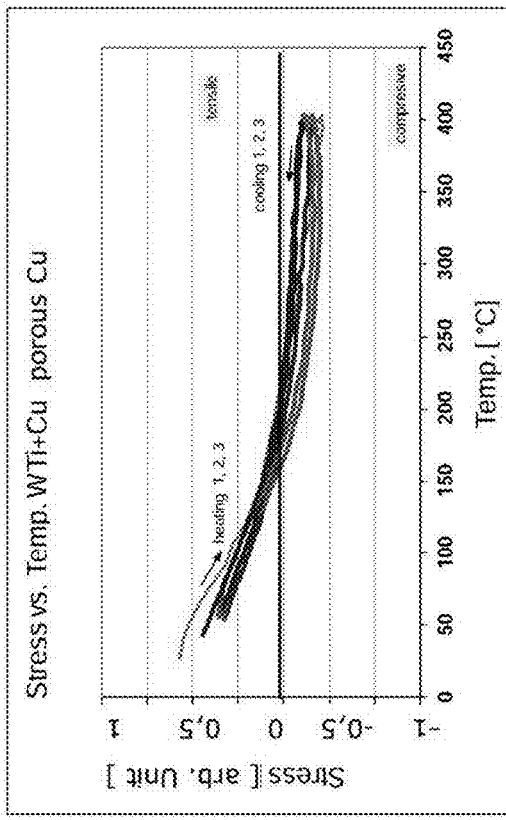
FIG 8B
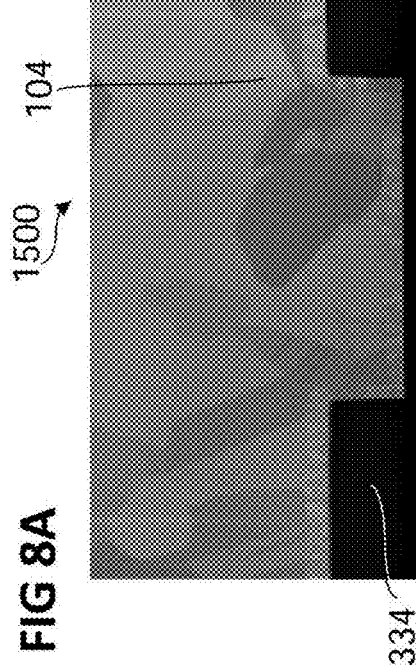
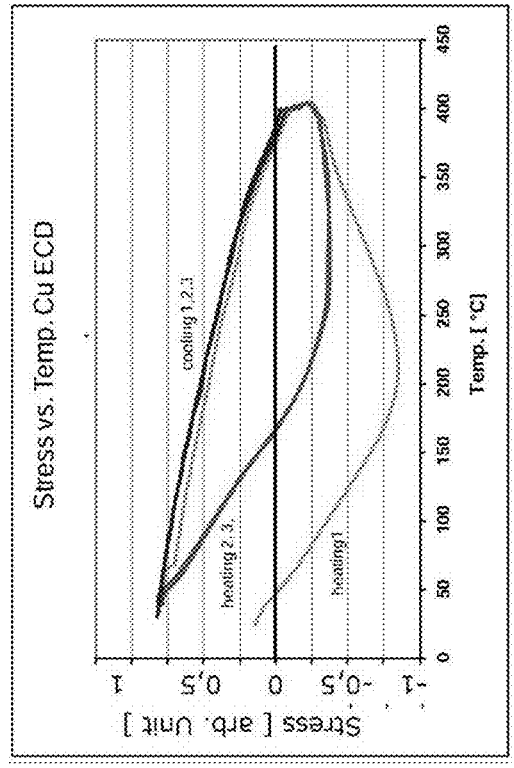

FIG 8C
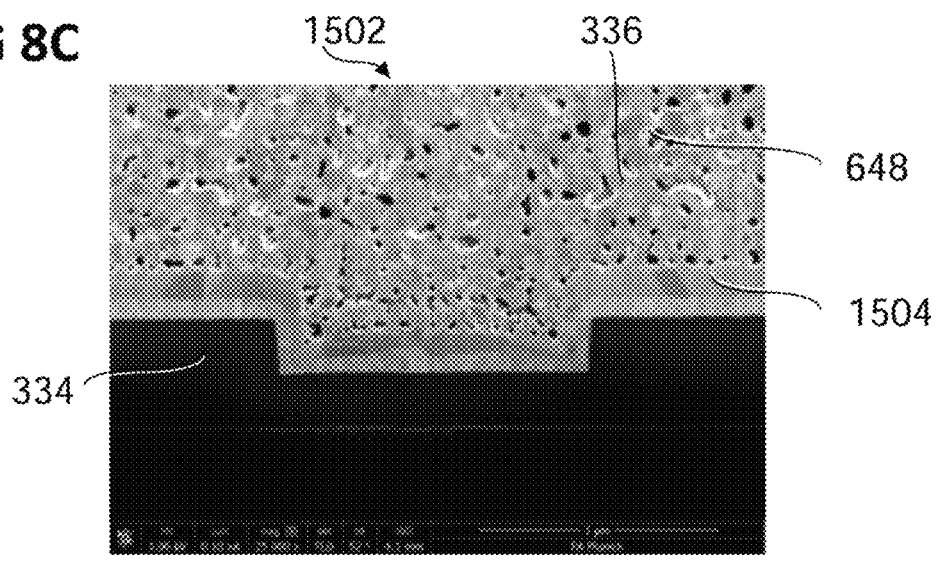
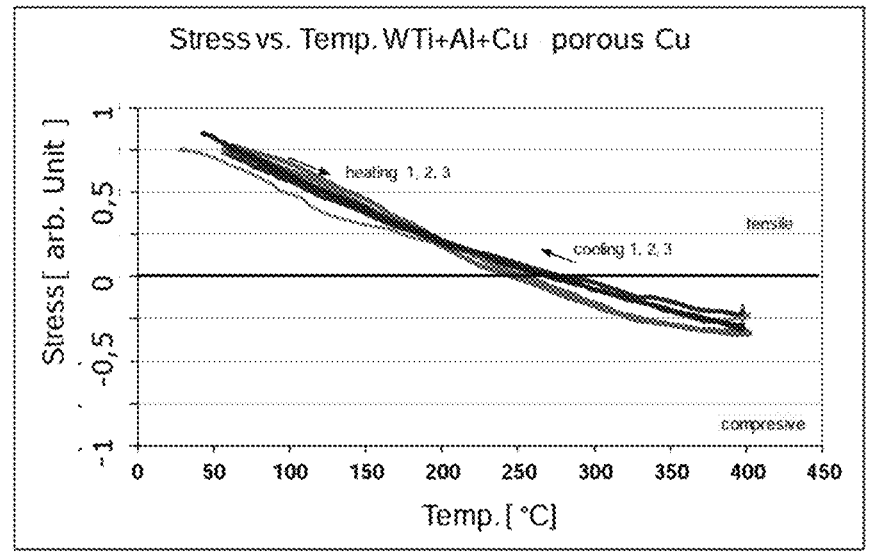
1502b

ELECTROLYTE, METHOD OF FORMING A COPPER LAYER AND METHOD OF FORMING A CHIP

CROSS-REFERENCE TO RELATED APPLICATIONS

This application is a continuation-in-part application of U.S. application Ser. No. 14/568,163 filed on Dec. 12, 2014, the contents of which are hereby incorporated by reference in their entirety.

TECHNICAL FIELD

Various embodiments relate generally to an electrolyte, to a method of forming a copper layer and to a method of forming a chip.

BACKGROUND

An electronic device, e.g. a modern power device, which may for example include a semiconductor chip, for example a silicon chip, may use one or more copper layers, e.g. thick copper layers for achieving a high current carrying capacity and/or for efficiently conducting heat away from the chip, or copper layers in a metallization layer, e.g. in a redistribution layer. A coefficient of thermal expansion (CTE) may differ significantly between the semiconductor material, e.g. the silicon (CTE~3 ppm/K), and the copper (CTE~16 ppm/K). As a consequence, a change in temperature may lead to mechanical stress in the copper layer and/or in an interface between the copper layer and the semiconductor chip, leading eventually to a degradation of the Cu-layer. In addition, a barrier layer may be required for preventing a diffusion of metal, e.g. Cu, atoms into the semiconductor, for example into a sublayer of transistors. However, such a barrier layer may adhere rather weakly to the Cu layer. This may further aid in the degradation of the Cu layer, for example by increasing a probability for delamination of the Cu layer from the semiconductor (with the barrier layer), or for a cracking of Cu grain boundaries in the Cu layer. For this purpose to improve adhesion an additional adhesion liner is necessary.

SUMMARY

In various embodiments, an electrolyte may be provided. The electrolyte may include at least one additive configured to decompose or evaporate at a temperature above approximately 100° C. and a water soluble metal salt, and the electrolyte may be free from carbon nanotubes. In various embodiments, a method of forming a metal layer may be provided: The method may include depositing a metal layer on a carrier using an electrolyte, wherein the electrolyte may include at least one additive configured to decompose or evaporate at a temperature above approximately 100° C. and a water soluble metal salt, wherein the electrolyte is free from carbon nanotubes; and annealing the metal layer to form a metal layer comprising a plurality of pores. In various embodiments, a semiconductor device may be provided. The semiconductor device may include a metal layer including a plurality of pores, wherein the plurality of pores may be formed in the metal layer as remnants of an additive having resided in the plurality of pores and having at least partially decomposed or evaporated. To keep a high elasticity over a wide temperature range (up to 450° C.), an adhesion layer may stabilize the metal grain boundaries and may fix dis- location gliding inside metal grains. In various embodiments, a metal layer is provided. The metal layer may include a plurality of pores having ellipsoidal or spheroidal shape.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2C show a process flows of methods of forming a copper layer in accordance with various embodiments;

FIG. 7 shows a plurality of focused ion beam cut images, each showing a copper layer formed using an electrolyte and/or a method of forming a copper layer according to various embodiments, wherein a pH-value and a current density have been varied; and FIGS. 8A to 8C show, in the top panel of each of the figures, an ion beam cut image of a conventional semiconductor device (FIG. 8A), a semiconductor device according to various embodiments with a copper layer including a plurality of pores (FIG. 8B), and a semiconductor device according to various embodiments with a copper layer including a plurality of pores and an adhesion layer (FIG. 8C), respectively. In the bottom panel of each of the figures, graphs indicating the stress of each of the semiconductor devices during thermal cycling are shown.

DESCRIPTION

Figure 1:
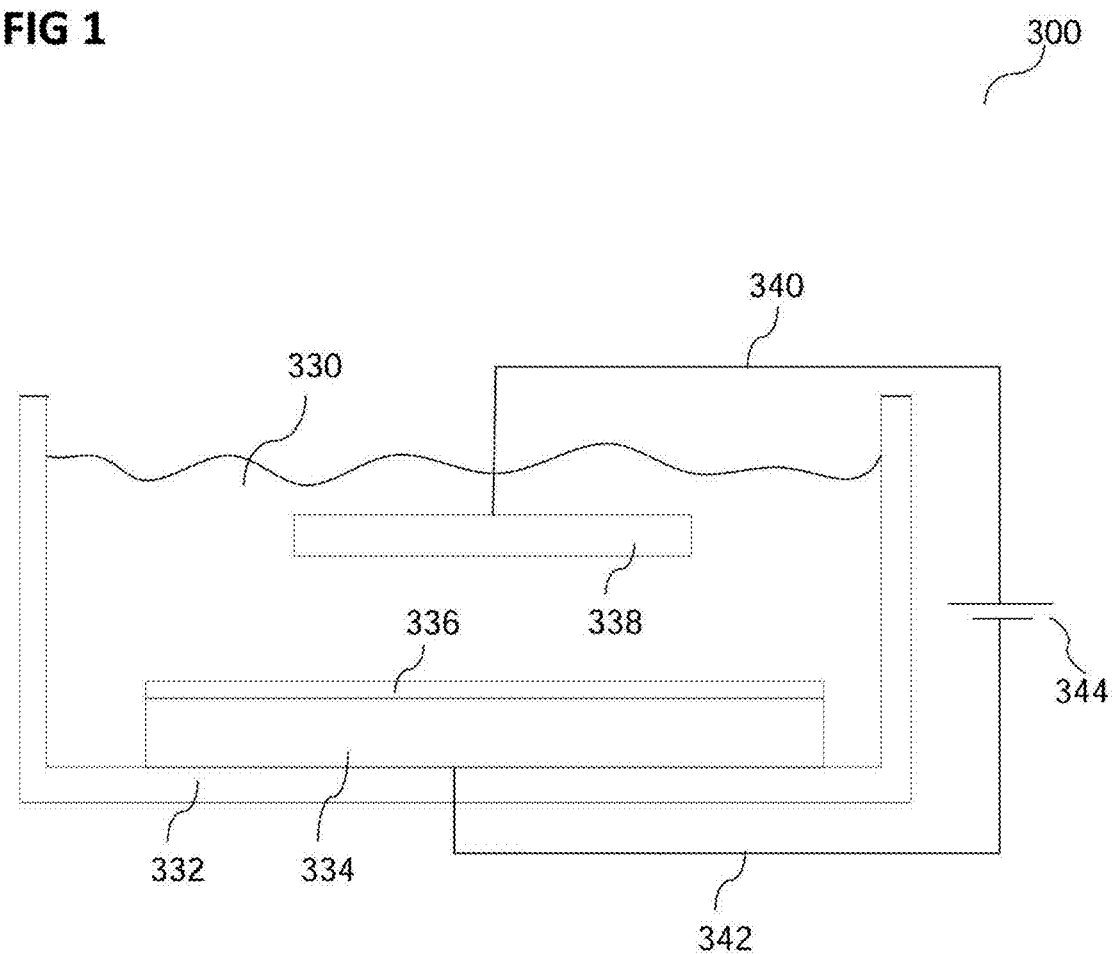
FIG. 1 shows a graphic representation of an experimental setup for conducting a method of forming a copper layer according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The terms electrodeposition, electroplating and galvanizing may be used as synonyms herein and may be understood to refer to a process in which an electrical current in an electrolyte is used to deposit metal ions dissolved in the electrolyte onto one of the electrodes. As a consequence, the deposited metal ions may form a layer or a structure of solid metal.

In various embodiments, a metal layer having a plurality of pores may be formed.

In various embodiments, an electrolyte may be provided. The electrolyte may include an additive configured to decompose or evaporate at a temperature above approximately 100° C., and a water soluble metal salt. The electrolyte may further include ammonium sulfate. The electrolyte may for example include ammonium sulfate, citric acid and copper sulfate. The electrolyte may be free from carbon nanotubes. The electrolyte may be used for forming a metal, e.g. copper, layer, for example for depositing a metal, e.g. copper, layer. In various embodiments, an electrolyte for forming a metal, e.g. copper, layer including a plurality of pores may be provided. After, e.g. directly after, the forming, e.g. the deposition, the metal layer may be free from pores or essentially free from pores.

In various embodiments, after the forming of the metal layer, the metal layer may be annealed. The annealing may for example include heating the metal, e.g. copper, layer, for example heating the metal, e.g. copper, layer to a temperature of between 100° C. and 600° C., for example for a duration of between 1 minute and 10 hours. The heating of the metal layer may for example be executed in an environment containing forming gas, for example to a temperature of about 400° C. for about 30 minutes. The annealing may cause a plurality of pores to form in the metal layer. The pores may have an impact, for example a beneficial impact, on thermomechanical properties of the metal e.g. copper layer. For example, during a temperature change, only little stress may form at a boundary of the metal layer to a carrier on which the metal layer may be formed, or within the metal layer. The stress may for example be lower than in a comparison metal, e.g. copper, layer with similar or the same outer dimensions, but without the plurality of pores. As has experimentally been shown for a copper layer, the stress in the copper layer may for example be reduced to less than half the stress in the comparison copper layer. Similarly beneficial effects may be achieved for metal layers including a plurality of pores and including or consisting of a metal different from copper, for example gold (Au), silver (Ag), platinum (Pt), palladium (Pd), nickel (Ni), or tin (Sn).

The forming, e.g. the deposition, of the metal layer from the electrolyte may be conducted in essentially the same way, e.g. using the same or similar facilities as used presently for forming, e.g. depositing, a metal layer without the plurality of pores. For example, finely structured electrically conductive copper lines may be formed using the electrolyte in a case of the electrolyte including copper sulfate as the water soluble metal salt. As has been shown experimentally, an electrically conductive connection to the copper layer, e.g. to a copper line, may be formed by soldering or bonding. Also in a case of the metal layer including or consisting of a different metal, an electrically conductive connection to the metal layer, e.g. to a metal line, may be formed by soldering or bonding.

In various embodiments, a method for forming a metal, e.g. copper, layer may be provided. The method may include forming, e.g. depositing, e.g. electroplating, a metal layer on a carrier using an electrolyte, wherein the electrolyte may include an additive configured to decompose or evaporate at a temperature above approximately 100° C. and a water soluble metal salt, e.g. copper sulfate, and wherein the electrolyte may be free from carbon nanotubes. Using this electrolyte for the deposition, the deposited metal layer may be suitable for forming a plurality of pores therein. The method may further include annealing the metal layer. The annealing of the metal layer may lead to the formation of the plurality of pores, which may improve various properties, e.g. thermomechanical properties, of the metal layer.

In various embodiments, a semiconductor device may be provided. The semiconductor device may include a metal, e.g. copper, layer including a plurality of pores, wherein the plurality of pores may be formed in the metal layer as remnants of an additive having resided in the plurality of pores and having at least partially decomposed or evaporated. The additive may have deposited on a carrier together with the metal, e.g. the copper, for example as particles of additive or as additive-copper-compound particles. The additive may have been distributed, for example essentially homogeneously, throughout the metal layer. During a heating process, e.g. an annealing process, during which the semiconductor device, which may include the carrier with the metal layer formed on it, may have been heated to a temperature above approximately 100° C., the additive may have decomposed or evaporated (at least partially), and may have left the plurality of pores behind.

In various embodiments, the pores formed in the metal layer by decomposition or evaporation of the additive may generally have a spheroidal (also referred to as globular) or ellipsoidal shape, as opposed to openings formed in sintered metal layers, which rather have a polygonal shape. Depending on various parameters, for example on a size and a concentration of the pores, the pores may be distributed in the layer essentially as individual pores, or several pores may be connected to each other, thereby forming larger and/or longer openings or channels in the metal layer, or a mixture of both types. In a case of the channels reaching one or more surfaces of the metal layer, and thus being connected to an outside of the metal layer, the metal layer may be open-pored. In a case of the pores not being connected to the outside of the metal layer, the metal layer may be closed porous.

In various embodiments, a reliability of a semiconductor device including a metal layer may be improved by improving a resilience of the metal layer and/or its connection to a semiconductor carrier during temperature changes. To this end, an electrolyte may be provided. Its composition (ammonium sulfate (optional), an additive configured to decompose at a temperature above approximately 100° C. a water soluble metal salt, no carbon nanotubes) may allow for a deposition of a metal layer that may allow for a plurality of pores to form in the copper layer during an annealing process.

The plurality of pores may improve thermomechanical properties of the metal layer, for example reduce an amount of work, e.g. thermodynamic work, to be performed during a thermal cycling of the semiconductor device and/or decrease an amount of hysteresis in the stress-temperature curve encountered during the thermal cycling of the semiconductor device.

In the electrolyte, the water soluble metal salt, e.g. copper sulfate, may provide the metal, e.g. copper, to be deposited. The additive may be deposited as individual complexes within the metal layer and may evaporate during an annealing of the metal layer, thereby forming the pores. The ammonium sulfate may increase a conductivity of the electrolyte. Its presence may improve a homogeneity of the pores, for example of a size and/or of a distribution of the pores.

In various embodiments, a common electroplating device may be used for depositing the metal layer.

In various embodiments, for example in a case of a barrier layer being formed between the metal layer (for example, a thick copper layer) and the semiconductor carrier for inhibiting a diffusion of metal, e.g. copper, atoms into the semiconductor carrier, an adhesion of the metal layer to the barrier layer may be improved by arranging an adhesion layer between the metal layer and the barrier layer. The adhesion layer may for example include or consist of a metal (e.g. aluminum) having a high binding energy with respect to both, the metal of the metal layer, e.g. the copper, and the material of the barrier layer. The barrier layer may for example include or consist of tungsten 90%-titan 10%, which may be used in particular for thick electro-chemically deposited metal systems because of its barrier properties and its suitability for wet-etching without leaving residuals. To keep a high elasticity over a wide temperature range (up to 450° C.), the additional adhesion layer (also referred to as liner metal) will stabilize the metal, e.g. Cu, grain boundaries and will fix dislocation gliding inside metal, e.g. Cu, grains. In various embodiments, the adhesion layer may diffuse into the metal, e.g. Cu, matrix (like doping), or form an alloy with the metal layer. This may for example be achieved during the annealing of the metal layer. An elasticity of the metal layer may be increased by the plurality of pores in the metal layer and by doping the metal layer out of the material of the adhesion layer The doping of the metal layer may be understood as at least some of the atoms of the adhesion layer relocating, e.g. diffusing, into the metal layer.

In various embodiments, the semiconductor device may be a chip. In other words, a method of forming a chip may be provided. The method may include depositing a metal layer over a semiconductor using an electrolyte, wherein the electrolyte may include an additive and a water-soluble metal salt. The method may further include annealing the metal layer to form a metal layer including a plurality of pores.

FIG. 1 shows a graphic representation of an experimental setup 300 for conducting a method of forming a metal layer 336 according to various embodiments.

In the experimental setup 300, an electrolyte 330 may be arranged in a container 332.

Even though the electrolyte 330 is described as being used in connection with the experimental setup 300, the electrolyte 330 may be used in connection with any other device or system that may allow for forming a metal layer using the electrolyte 330.

In various embodiments, the electrolyte 330 may include a water soluble metal salt, e.g. copper sulfate ($CuSO_4$), e.g. copper sulfate pentahydrate ($CuSO_4$ $5H_2O$), ammonium sulfate $(NH_4)_2SO_4$ (optional), and an additive.

In various embodiments, the water soluble metal salt may include a sulfate, a nitrate, a cyanide, for example copper sulfate ($CuSO_4$), e.g. copper sulfate pentahydrate ($CuSO_4$ $5H_2O$), silver nitrate, nickel sulfate, silver cyanide, potassium gold cyanide, or any other water soluble metal salt that may be suitable for electroplating a metal layer.

In various embodiments, the metal of the metal salt may be deposited by the electroplating as the metal layer. The metal of the metal layer (and thus of the metal salt) may include or consist of any metal that may be electroplated, for example copper (Cu), gold (Au), silver (Ag), platinum (Pt), palladium (Pd), nickel (Ni), and/or tin (Sn).

In various embodiments, the additive may have the following properties: The additive may be soluble in water, in other words capable of dissolving in water, and/or mixable with water, in other words form a homogeneous mixture with water (as opposed to, e.g., separate layers of water and additive). The additive may decompose or evaporate completely or partially when heated, e.g. heated above a temperature of about 100° C., e.g. above about 200° C., e.g. to a temperature in a range from about 100° C. to about 600° C. The additive may be an organic molecule, for example a carboxylic acid, a derivative thereof or a salt thereof.

In various embodiments, the additive may be saturated, partially unsaturated or unsaturated. The additive may be branched or unbranched.

In various embodiments, a plurality of additives may be used, e.g. as a mixed additive.

In various embodiments, the additive may be described by the formula $(CRR'R''R''')_n$, wherein n may be larger or equal to 1 and smaller than or equal to 20,000, and wherein the attachments R, R', R'', and R''' may be defined individually for each C-atom from the following group of attachments: COOQ, C(O)X, C(O)Q, C(O)NQ, CN, COQ, SQ, H, NQQ', SOO(OQ), C(O)OOQ, O, OH, wherein $Q=(CRR'R''R''')_m$ or H, and X=F, Cl, Br, m may be larger or equal to 1 and smaller than or equal to 20,000. R, R', R'', and R''' need not all be present in a given molecule or for a given C atom.

Examples of the Additive Include the Following:

Methanoic Acid (Also Referred to as Formic Acid)

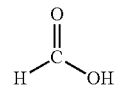

According to the above definition, n=1, R=H, R'=O and R''=OH. Since the oxygen is double bonded to the carbon, R''' is not present.

Ethanoic Acid (Also Referred to as Acetic Acid)

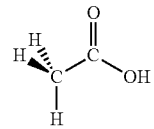

In accordance with the above definition, n=2, R(C1)=R'(C1)=R''(C1)=H, R(C2)=O, R'(C2)=OH. Alternatively, and also in accordance with the above definition, n=1, R=R'=R''=H, R'''=COOH.

Butanoic Acid (Also Referred to as Butyric Acid)

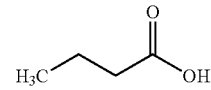

In accordance with the above definition, n=4, R(C1)=R'(C1)=R"(C1)=H, R(C2)=R'(C2)=H, R(C3)=R'(C3)=H, R(C4)=O, R'(C4)=OH. Alternatively, and also in accordance with the above definition, n=3, R(C1)=R'(C1)=R"(C1)=H, R(C2)=R'(C2)=H, R(C3)=R'(C3)=H, R"(C3)= COOH.

Citric Acid

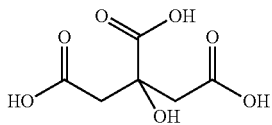 [SMILES: O=C(O)CC(O)(CC(=O)O)C(=O)O]

In accordance with the above definition, n=5, R(C1)=O, R'(C1)=OH, R(C2)=R'(C2)=H, R(C3)=COOH, R'(C3)= OH, R(C4)=R'(C4)=H, R(C5)=O, R'(C5)=OH. Alternatively, and also in accordance with the above definition, n=3, R(C1)=R'(C1)=H, R'(C1)=COOH, R(C2)=COOH, R'(C2)=OH, R(C3)=R'(C3)=H, R'(C3)= COOH.

Oxalic Acid (Also Referred to as Ethanedioic Acid)

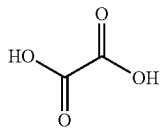

In accordance with the above definition, n=2, R(C1)=P, R'(C1)=OH, R(C2)=O, R'(C2)=OH. Alternatively, and also in accordance with the above definition n=1, R(C1)=O, R'(C1)=OH, R"(C1)=COOH.

Ethylenediaminetetraacetic Acid, Commonly Abbreviated as EDTA

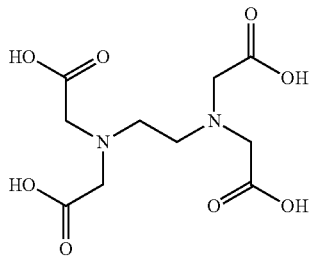 [SMILES: O=C(O)CN(CCN(CC(=O)O)CC(=O)O)CC(=O)O]

In accordance with the above definition, n=2, R(C1)=R(C2)=NQQ' with Q=Q'=(CRR'R"R''')m, wherein m=2 and R(C1(Q))=R'(C1(Q))=R(C1(Q'))=R'(C1(Q'))=H, R(C2(Q))=R(C2(Q'))=O and R'(C2(Q))=R'(C2(Q'))=OH. Alternatively, and also in accordance with the above definition n=2, R(C1)=R(C2)=NQQ' with Q=Q'=(CRR'R"R''')m, wherein m=1 and R(C1(Q))=R'(C1(Q))=R(C1(Q'))=R'(C1(Q'))=H, R"(C1(Q))=R"(C1(Q')=COOH.

Polyvinyl Alcohol (for Example with n=100)

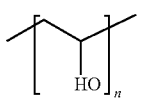

In accordance with the above definition, n=100, R(C1-C100)=R'(C1)=R'(C100)=R"(C1)=R"(C100)=H and R'(C2-C99)=OH.

Examples of the additive include methanoic acid, ethanoic acid, propanoic acid, propanedioic acid (also referred to as malonic acid or as 1,3 propanedioic acid), butanoic acid, butanedioic acid (also referred to as succinic acid or as 1,4 butanedioic acid), ethanedioic acid (also referred to as oxalic acid), 2-hydroxypropane-1,2,3-trioic acid (also referred to as citric acid), pentanedioic acid (also referred to as glutaric acid), hydroxymalonic acid (also referred to as tartronic acid), 2,3-dihydroxybutanedioic acid (also referred to as tartaric acid), 2-hydroxybutanedioic acid (also referred to as malic acid), oxobutanedioic acid (also referred to as oxalacetic acid), acrylic acid, 3-butenoic acid, cis-butenedioic acid (also referred to as maleic acid), trans-butenedioic acid (also referred to as fumaric acid), methane tricarboxylic acid, 2-hydroxypropanoic acid (also referred to as lactic acid), diaminoethane-tetraacetic acid, diethylenetriaminepentaacetic acid (also referred to as pentetic acid), triethylenetetraminehexaacetic acid, methanol, ethanol, methyl acetate, ethyl acetate, and 3-hydroxybutanoic acid.

The electrolyte 330 may, in various embodiments, be free from carbon nanotubes. The electrolyte 330 may be free from carbon allotropes, e.g. particles consisting of carbon, such as carbon fibers, graphite, fullerenes, etc. The electrolyte 330 may be free from particles, in other words, the electrolyte 330 may not be a suspension out of which particles may sediment.

In various embodiments, a concentration of the additive may be in a range from about 0.05 g/l to about 50 g/l, e.g. from about 0.1 g/l to about 30 g/l, e.g. from about 2.5 g/l to about 15 g/l, e.g. from about 4 g/l to about 10 g/l, e.g. about 5 g/l.

In various embodiments, a concentration of the water soluble metal salt, e.g. of copper sulfate, e.g. of copper sulfate pentahydrate, may be in a range from about 50 g/l to about 250 g/l, e.g. from about 50 g/l to about 150 g/l, e.g. from about 80 g/l to about 120 g/l, e.g. about 100 g/l.

In various embodiments, a concentration of ammonium sulfate may be in a range from about 20 g/l to about 80 g/l, e.g. from about 40 g/l to about 60 g/l, e.g. about 50 g/l.

In various embodiments, a relative concentration of an additive, e.g. of citric acid, and a water soluble metal salt, e.g. of copper sulfate, e.g. copper sulfate pentahydrate, may be in a range from about 1/50 to about 1/10, for example about or exactly 1/20. In other words, a ratio of the water-soluble metal salt, e.g. the copper sulfate, e.g. copper sulfate pentahydrate, and the additive, e.g. the citric acid, may be in a range from about 10 to about 50, e.g. about 20, e.g. exactly 20. A relative concentration of ammonium sulfate and water-soluble metal salt, e.g. copper sulfate, e.g. copper sulfate pentahydrate, may be in a range from about 1/3 to about 2/3, for example about 1/2. In other words, a ratio of the water-soluble metal salt, e.g. the copper sulfate, e.g. copper sulfate pentahydrate, and ammonium sulfate may be in a range from about 1.5 to about 3, e.g. about 2, e.g. exactly 2. A relative concentration of ammonium sulfate and the additive, e.g. the citric acid, may be in a range from about 1/20 to about 1/5, for example about 1/10. In other words, a ratio of ammonium sulfate over the additive may be in a range from about 5 to about 20, e.g. about 10, e.g. exactly 10.

In various embodiments, the electrolyte 330 may further include other components, for example acidic and/or alkaline components, for example for lowering or raising a pH value of the electrolyte 330, for example $H_2SO_4$ or $NH_4OH$, respectively. The pH value of the electrolyte 330 may be in a range from about 1.4 to about 2.7, for example in a range from about 1.9 to about 2.5, e.g. about or exactly 2.25. In other words, $H_2SO_4$ or any other suitable acidic component and/or NH$_4$OH or any other suitable alkaline component may be included in the electrolyte 330 for adjusting its pH value to be in the range from about 1.4 to about 2.7, e.g. from about 1.9 to about 2.5, e.g. about or exactly 2.25.

In various embodiments, the container 332 may be any container 332 that is suitable for depositing in it a copper layer 336 on a carrier 334 using a method of forming a copper layer 336 according to various embodiments. The container 332 may for example be a container of a device that is commonly used for electroplating a carrier with a copper layer. The container 332 may for example be configured to hold the electrolyte 330, the carrier 334 and an electrode 338, e.g. an anode 338, in its volume, with the carrier 334 and the anode 338 physically and electrically contacting the electrolyte 330.

In various embodiments, the carrier 334 may form an electrode, e.g. a cathode. The experimental setup 300 may include an anode 338. The anode 338 may for example include or consist of a metal, e.g. of copper, or may be an inert anode, e.g. platinized titanium. The carrier 334 and the anode 338 may be electrically connected to a power source 344 by electrically conductive lines 342 and 340, respectively. A current density provided by the power source 344 may be in a range from about 0.1 A dm$^{-2}$ to about 10 A dm$^{-2}$, e.g. from about 1 A dm$^{-2}$ to about 4 A dm$^{-2}$ e.g. about or exactly 1 A dm$^{-2}$ or about or exactly 3 A dm$^{-2}$.

In various embodiments, the carrier 334 may be arranged to physically contact the electrolyte 330. The carrier 334 may be made of or include a semiconductor material, for example at least one semiconductor material from a group of semiconductor materials, the group consisting of silicon, silicon-carbide, gallium-nitride, germanium, gallium arsenide, indium antimonide, zinc selenide, and cadmium sulfide, or any other from the group of III-V or II-VI compound semiconductors. The carrier 334 may for example be or include a wafer, e.g. a silicon wafer.

In various embodiments, the carrier 334 may include at least one additional layer. The at least one additional layer may for example include a metal, a semiconductor or a dielectric, e.g. at least one of a group consisting of copper (Cu), silver (Ag), gold (Au), aluminum (Al), titanium (Ti), chromium (Cr), tungsten (W), tungsten titanium alloy (TiW), titanium nitride (TiN), tantalum (Ta), tantalum nitride (TaN), zinc (Zn), tin (Sn), nickel (Ni), lead (Pb) and cobalt (Co). The at least one additional layer may for example act as a seed layer promoting the forming of the metal layer 336 on the carrier 334, and/or it may act as a barrier layer for preventing a diffusion, e.g. from the carrier 334 towards the metal layer 336 or in the reverse direction, and/or it may act as a contact layer, also referred to as an adhesion layer or as an adhesion and doping layer, for improving a contact, e.g. an adhesion, between the carrier 334 and the metal layer 336 and finally act as a dopant material for the bulk metal, e.g. Cu, above. In a case of the at least one additional layer acting as the adhesion layer, the at least one additional layer, i.e. the adhesion layer, may include a metal. The adhesion layer may include or consist of one or more metal(s) of a group of metals consisting of aluminum (Al), titanium (Ti), zinc (Zn), tin (Sn), nickel (Ni), silver (Ag), gold (Au), molybdenum (Mo) and lead (Pb). The adhesion layer may have a thickness in a range from less than 10 nm to about 1000 nm, for example from less than 20 nm to about 500 nm. In a case of the at least one additional layer acting as the barrier layer, the at least one additional layer, i.e. the barrier layer, may have a thickness in a range from about 50 nm to about 500 nm. In a case of the at least one additional layer acting as the seed layer, the at least one additional layer, i.e. the seed layer, may have a thickness in a range from about 50 nm to about 500 nm.

In various embodiments, the metal, e.g. copper, layer 336 may be formed on the at least one additional layer 334. In other words, the metal layer 336 may be formed over the semiconductor material of the carrier 334 in such a way that the at least one additional layer is arranged between the semiconductor material of the carrier 334 and the copper layer 336. The additional layer may be formed on the semiconductor material of the carrier 334 for example by means of deposition, for example sputtering or chemical vapor deposition, e.g. atomic layer deposition.

In various embodiments, the at least one additional layer may include a plurality of additional layers, for example a barrier layer and a seed layer, a barrier layer, an adhesion layer and a seed layer, or an adhesion layer and a seed layer.

In various embodiments, the experimental setup 300 may be used for forming, e.g. depositing, the metal layer 336 on the electrode 334, e.g. the carrier 334, e.g. the semiconductor 334. The metal layer 336 may be electroplated on the carrier 334. In other words, by supplying power to the cathode 334 (the carrier 334) and to the metal anode, e.g. the copper anode 338, by means of the power source 344, the metal ions, e.g. copper ions, in the electrolyte 330 may be drawn towards the cathode 334 and be deposited there as the metal layer, e.g. copper layer, 336.

The electrolyte 330 may be configured (e.g. regarding ingredients, relative amounts of the ingredients, pH value of the electrolyte) as described above. Depositing the metal layer 336 from this electrolyte may cause the metal layer 336 to form in such a way that it may be suitable for having a plurality of pores formed therein. For example, at least a part of the additive of the electrolyte may be included in the metal layer. The additive may for example be distributed in the metal layer, for example as additive particles or as additive complexes, e.g. as metal-additive complexes.

In various embodiments, a heating process, for example as described below, may be performed on the metal layer 336 including the additive. The heating process may for example be an annealing process. The metal layer 336, for example the carrier 334 with the metal layer 336 deposited on it, may be heated to a temperature, e.g. a maximum temperature, in a range from about 100° C. to about 600° C. A duration of the heating, e.g. the annealing, process may be in a range from about 1 minute to about 10 hours. The temperature and duration of the heating process may depend on a variety of parameters and may be adjusted as required. However, the temperature may be chosen to reach at least a decomposition temperature or evaporation temperature of the additive, and the duration may be chosen at least sufficiently long for at least a fraction, e.g. at least 10%, e.g. at least 20%, e.g. at least 50%, e.g. at least 80%, e.g. at least 90%, of the additive to decompose or evaporate. Thereby, i.e. by a removal of the additive from the metal layer 336 through decomposition or evaporation, a plurality of pores (see below, e.g. in context with FIGS. 2A to 2C, FIG. 3A and FIG. 3B) may be formed in the metal layer 336.

In various embodiments, the additive may be configured to decompose or evaporate at least partially, e.g. completely, during a heating process, e.g. during an annealing process, e.g. when the metal layer 336 is heated to a temperature of 100° C. or more.

In other words, the plurality of pores in the metal layer 336 may form by deliberate decomposition or evaporation, during the heating of the metal layer 336, e.g. during an annealing process, of the additive deposited, during the deposition of the metal layer 336, in the metal layer 336, e.g. as particles distributed in the metal layer 336.

In various embodiments, the plurality of pores may have an advantageous effect on thermomechanical properties of the metal layer 336, and/or on the carrier-metal layer-combination and/or on the carrier-metal layer interface, respectively. For example, a stress occurring in a device including a carrier 334 and a metal layer 336 formed on it may be lower and show less hysteresis during a cycle of repeated heating and cooling for a metal, e.g. copper, layer having a plurality of pores (see FIG. 8B) than for a metal, e.g. copper, layer without pores (see FIG. 8A). The reduction of the stress in the layer(s) may result in a smaller bending of the carrier 334. In a case where the carrier 334 is a wafer, the bending may be referred to as wafer bow, which may thus be reduced, for example a wafer bow occurring during manufacture. The reduced stress on the carrier-metal layer interface may result in a reduced risk of delamination during thermal cycling, i.e. the thermal stress induced by thermal cycling.

In various embodiments, a size, for example an average diameter, of crystallites of the copper layer 336 may be small as compared with conventionally deposited copper layers, e.g. copper layers deposited using a conventional electrolyte. In various embodiments, the size of the copper crystallites may be smaller than about 12 nm, for example in a range from about 5 nm to about 10 nm. Even after annealing, the size of the copper crystallites may remain small, for example smaller than about 100 nm, for example in a range from about 10 nm to about 50 nm, for example from about 10 nm to about 20 nm.

In various embodiments, the electrolytic deposition of the metal layer 336 may be executed essentially like a known electrolytic deposition process (in a case of a structured metal layer 336 this may also be referred to as pattern plating process), e.g. using a regular plating device as described as the experimental setup 300 in context with FIG. 1, but the electrolyte 330 may be selected as described above. Thereby, finely structured patterns, e.g. patterns of conductive lines and the like, may be obtained just like with regular pattern plating tools. In addition, it has been shown that the deposited metal, e.g. copper, layer 336 as described above may be suitable for soldering and bonding. In other words, electrically conductive structures like conductive lines, wires, electronic devices, e.g. semiconductor devices, may be soldered or bonded to the metal layer 336.

In various embodiments, the metal layer 336 may be a continuous metal layer 336. In various embodiments, the metal layer 336 may be a structured metal layer 336. The metal layer 336 may for example include a plurality of electrically connected and/or unconnected metal lines (e.g. copper lines, also referred to as copper conductor tracks). The structured metal layer 336 may for example be obtained by forming a mask, e.g. a dielectric mask, e.g. a photolithographic mask, on the carrier 334 before the deposition of the metal layer 336 on the carrier 334. In that way, the metal layer 336 may only form in regions where an electrically conductive part of the carrier 334 is exposed to the electrolyte 330, e.g. in regions where the mask, e.g. the dielectric mask, e.g. the photolithographic mask, is absent.

In various embodiments, when forming, e.g. depositing, the metal layer 336, apart from the metal ions, also other components of the electrolyte 330 may be deposited, e.g. embedded in and/or forming part of the metal layer 336. For example, the additive may at least partially be embedded in the metal layer 336, for example in a plurality of positions.

The plurality of metal complexes, e.g. copper complexes, may for example form if a pH value of the electrolyte 330 is above 1.0, e.g. 1.5 or higher, e.g. 1.9 or higher. The plurality of metal complexes may be embedded in the metal layer 336, e.g. during the forming, e.g. the deposition, of the metal layer 336. The plurality of metal complexes may be arranged in a plurality of positions throughout the metal layer 336.

In various embodiments, the setup 300 may be used for forming a semiconductor device. The semiconductor device may include the metal layer 336 as described above, i.e. the metal layer 336 including the plurality of pores. The metal layer 336 may be arranged, e.g. formed, for example using the process described herein, by deposition over the carrier 334. The semiconductor device may for example be a power semiconductor device, e.g. a power diode, thyristor, power MOSFET, or IGBT, a microelectromechanical system (MEMS), or any other kind of semiconductor device.

FIG. 2A shows a process flow 400A of a method of forming a metal layer in accordance with various embodiments.

In various embodiments, the method of forming a metal layer may include depositing a metal layer on a carrier using an electrolyte, wherein the electrolyte may include an additive and a water soluble metal salt, wherein the electrolyte may be free from carbon nanotubes, and wherein the additive may be configured to decompose or evaporate at a temperature above approximately 100° C. (in 409).

The depositing of the metal layer may be executed, e.g. as described above in accordance with various embodiments, as an electrodeposition of the metal layer on the carrier.

In various embodiments, the electrolyte used for the depositing of the metal layer on the carrier may include the additive and a water soluble metal salt. A concentration, function etc. of the additive of the electrolyte during the depositing of the metal layer may correspond to the concentration, function etc. of the additive in the electrolyte described above in context with FIG. 1. Instead of a single additive, a plurality of additives may be used. A concentration, function etc. of the water soluble metal salt of the electrolyte during the depositing of the metal layer may correspond to the concentration, function etc. of the water soluble metal salt in the electrolyte described above in context with FIG. 1.

In various embodiments, the electrolyte used in 409 for the depositing of the metal layer may include further components, for example as described above in context with FIG. 1. The electrolyte may for example include ammonium sulfate, $H_2SO_4$ and/or $NH_4OH$. Components, relative and absolute concentrations, etc. may correspond to those described above.

The carrier may be a carrier as described above in accordance with various embodiments.

In various embodiments, the method may further include an annealing of the metal layer to form a metal layer including a plurality of pores (in 420).

The annealing of the metal layer may include a heating of at least the metal layer, e.g. of the metal layer and the carrier over, e.g. on, which the metal layer is formed. The metal layer may be heated up to a temperature of about 200° C. or above, for example to about 250° C. or above, for example to about 300° C. or above, for example to about 400° C. or above. The temperature reaching or exceeding a certain target temperature, e.g. the 200° C., 250° C., 300° C. or 400° C. cited above, may be referred to as the elevated temperature or as the annealing temperature.

In various embodiments, the temperature of the metal layer may be kept at the elevated temperature for a duration of 4 hours or less, for example for 1 hour or less, for example for 30 minutes or less, for example for 20 minutes or less, for example for 15 minutes or less. In other words, a maximum duration for the heating process may be determined from the time that the elevated temperature is reached. In various embodiments, a process of heating the metal layer to the elevated temperature and keeping the metal layer at the elevated temperature may be executed for a duration of 4 hours or less, for example for 1 hour or less, for example for 30 minutes or less, for example for 20 minutes or less, for example for 15 minutes or less. In other words, a maximum duration for the heating process may include the heating to the elevated temperature. The metal layer may for example be heated to a temperature of 400° C. and kept at that temperature for a total duration of 30 minutes.

Annealing the metal layer, e.g. heating the metal layer up to a temperature of about 200° C., may lead to the formation of the plurality of pores in the metal layer. If the annealing temperature is below 100° C., a forming of the pores may not occur. The pores may be formed when the additive, which may be arranged, for example as additive particles or as additive complexes, e.g. as metal-additive-complexes, in a plurality of positions within the metal layer as described above, decomposes, which may happen at a temperature of more than about 100° C., e.g. above about 160° C. or, e.g., about 175° C. or above. The additive may decompose to form various gaseous decomposition products, for example in a case of the additive being citric acid, it may decompose to form carbon dioxide ($CO_2$), acetone ($(CH_3)_2CO$), and/or acetic acid ($CH_3COOH$). The decomposition of the additive to the gaseous decomposition products may cause the formation of the plurality of pores. In other words, the additive embedded in the metal layer may outgas during the annealing and may thereby form the plurality of pores in the metal layer. The gaseous decomposition products may, at least partially, leave the metal layer.

In various embodiments, instead of decomposing, the additive may evaporate. In other words, the additive, rather than decomposing, may change from a solid or liquid state into a gaseous state.

In various embodiments, the pores, i.e. each individual pore, may be spheroidal or ellipsoidal in shape. In various embodiments, for example in a case of the pores being large and/or of the pore density being high, two or more pores may combine to form a larger pore, which may for example be elongated or have an irregular shape. However, a wall structure of the pores may still show a plurality of convex regions (as seen from the pore), thereby differing from openings formed in sindered material, which may rather be polygonal in shape, and/or have a wall shape that may have concave regions (as seen from the pore). The combining, also referred to as joining, of pores may occur in a plurality of locations within the metal layer 336.

The plurality of pores may be distributed, e.g. homogeneously, throughout the metal layer. In various embodiments, a homogeneity of the distribution of the plurality of pores in the metal layer may be improved by the ammonium sulfate being present in the electrolyte. A density, e.g. a volume density of the pores, which may correspond to a fraction of a volume of the metal layer occupied by the plurality of the pores, may be in a range from about 1% to about 50%, e.g. from about 5% to about 25%, e.g. about 10%. In other words, about 1% to 50%, e.g. about 5% to 25% of the volume of the metal layer may be occupied by the pores. A number density of the pores in the metal layer, which may correspond to a total number of the pores in the metal layer if a total volume of the metal layer stays the same, and/or an average size, e.g. an average volume or an average diameter, of the pores, and/or a total volume of the pores may increase with an increase of the additive concentration, e.g. the additive concentration, with the annealing temperature, and/or with the current density.

During pore formation by heating the stack of metals simultaneously, the adhesion layer may be doping the metal of the metal layer, e.g. copper (Cu), by diffusion of adhesion metal atoms into the metal (e.g. Cu) matrix.

This doping of the metal by suitable atoms will increase the elasticity of the metal, e.g. the Cu, over an increased temperature range, and therefore plastical deformation of the metal layer, e.g. the Cu film, may be reduced.

Experiments have shown that the formation of the pores may depend on a presence (and concentration) of the additive in the electrolyte. The formation of the pores may further depend on a pH value of the electrolyte, the current density applied for forming the metal layer, the concentration of the water soluble metal salt in the electrolyte, and on the concentration of ammonium sulfate. The formation of the pores may have a stronger dependence on the presence (and concentration) of the additive in the electrolyte than on the other parameters cited above.

Figure 2B:
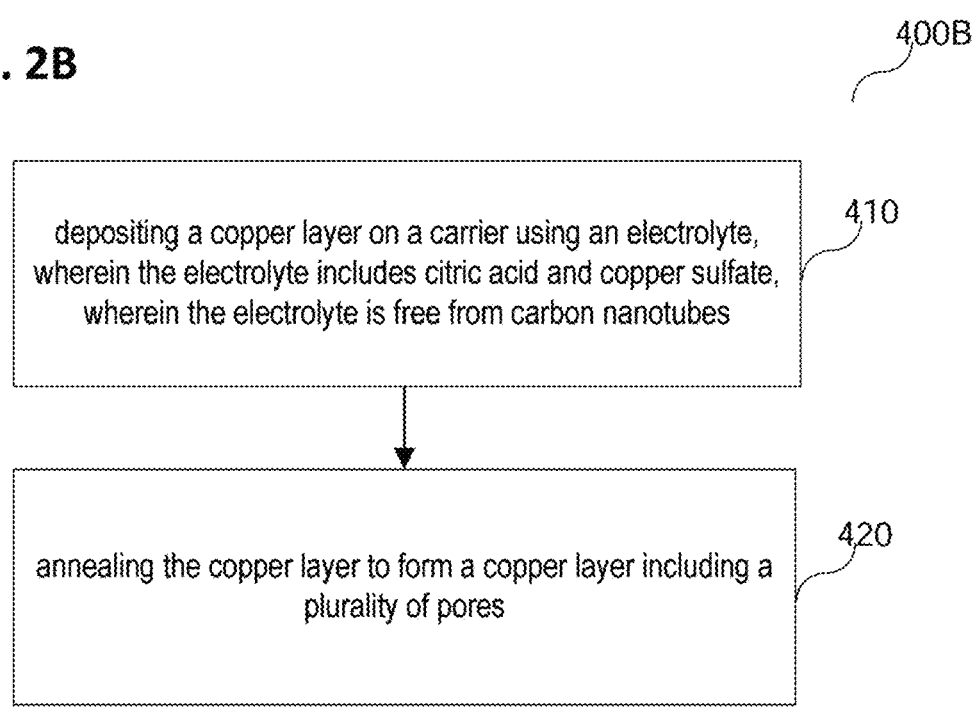

FIG. 2B shows a process flow 400 of a method of forming a copper layer in accordance with various embodiments.

In various embodiments, the method of forming a copper layer may include depositing a copper layer on a carrier using an electrolyte, wherein the electrolyte may include an additive and copper sulfate, and wherein the electrolyte may be free from carbon nanotubes (in 410).

The depositing of the copper layer may be executed, e.g. as described above in accordance with various embodiments, as an electrodeposition of the copper layer on the carrier.

In various embodiments, the electrolyte used for the depositing of the copper layer on the carrier may include citric acid and copper sulfate. A concentration, function etc. of the citric acid of the electrolyte during the depositing of the copper layer may correspond to the concentration, function etc. of the citric acid in the electrolyte described above in context with FIG. 1. A concentration, function etc. of the copper sulfate of the electrolyte during the depositing of the copper layer may correspond to the concentration, function etc. of the copper sulfate in the electrolyte described above in context with FIG. 1.

In various embodiments, the electrolyte used in 410 for the depositing of the copper layer may include further components, for example as described above in context with FIG. 1. The electrolyte may for example include ammonium sulfate, $H_2SO_4$ and/or $NH_4OH$. Components, relative and absolute concentrations, etc. may correspond to those described above.

The carrier may be a carrier as described above in accordance with various embodiments.

In various embodiments, the method may further include an annealing of the copper layer to form a copper layer including a plurality of pores (in 420).

The annealing of the copper layer may include a heating of at least the copper layer, e.g. of the copper layer and the carrier on which the copper layer is formed. The copper layer may be heated up to a temperature of about 200° C. or above, for example to about 250° C. or above, for example to about 300° C. or above, for example to about 400° C. or above. The temperature reaching or exceeding a certain target temperature, e.g. the 200° C., 250° C., 300° C. or 400° C. cited above, may be referred to as the elevated temperature or as the annealing temperature.

In various embodiments, the temperature of the copper layer may be kept at the elevated temperature for a duration of 4 hours or less, for example for 1 hour or less, for example for 30 minutes or less, for example for 20 minutes or less, for example for 15 minutes or less. In other words, a maximum duration for the heating process may be determined from the time that the elevated temperature is reached. In various embodiments, a process of heating the copper layer to the elevated temperature and keeping the copper layer at the elevated temperature may be executed for a duration of 4 hours or less, for example for 1 hour or less, for example for 30 minutes or less, for example for 20 minutes or less, for example for 15 minutes or less. In other words, a maximum duration for the heating process may include the heating to the elevated temperature. The copper layer may for example be heated to a temperature of 400° C. for a duration of 30 minutes.

Annealing the copper layer, e.g. heating the copper layer up to a temperature of about 200° C., may lead to the formation of the plurality of pores in the copper layer. If the annealing temperature is 150° C. or below, a forming of the pores may (in this embodiment, with the additive being citric acid; in other embodiments using a different additive, an annealing temperature below 150° C. may be sufficient for forming the pores) not occur. The pores may be formed when the citric acid, which may be arranged, for example as particles or as citrate complexes, e.g. as copper-citrate-complexes, in a plurality of positions within the copper layer as described above, decomposes, which may happen at a temperature of about 160° C. or above, e.g. about 175° C. or above. The citric acid may decompose to form various gaseous decomposition products, e.g. carbon dioxide ($CO_2$), acetone ($(CH_3)_2CO$), and/or acetic acid ($CH_3COOH$). The decomposition of the citric acid to the gaseous decomposition products may cause the formation of the plurality of pores. In other words, the citric acid embedded in the copper layer may outgas during the annealing and may thereby form the plurality of pores in the copper layer. The gaseous decomposition products may, at least partially, leave the copper layer.

The plurality of pores may be distributed, e.g. homogeneously, throughout the copper layer. In various embodiments, a homogeneity of the distribution of the plurality of pores in the copper layer may be improved by the ammonium sulfate being present in the electrolyte. A density, e.g. a volume density of the pores, which may correspond to a fraction of a volume of the copper layer occupied by the plurality of the pores, may be in a range from about 1% to about 50%, e.g. from about 5% to about 25%, e.g. about 10%. In other words, about 1% to 50%, e.g. about 5% to 25% of the volume of the copper layer may be occupied by the pores. A number density of the pores in the copper layer, which may correspond to a total number of the pores in the copper layer if a total volume of the copper layer stays the same, and/or an average size, e.g. an average volume or an average diameter, of the pores, and/or a total volume of the pores may increase with an increase of the citric acid concentration, with the annealing temperature and/or with the current density.

Experiments have shown that the formation of the pores may depend on a presence (and concentration) of the citric acid in the electrolyte. The formation of the pores may further depend on a pH value of the electrolyte, the current density applied for forming the copper layer, the concentration of copper sulfate in the electrolyte, and on the concentration of ammonium sulfate. The formation of the pores may have a stronger dependence on the presence (and concentration) of the citric acid in the electrolyte than on the other parameters cited above.

As shown in FIG. 2C, in various embodiments, a method of forming a semiconductor device may include forming an adhesion layer over a carrier (in 401).

In various embodiments, the carrier may be a carrier as described above.

In various embodiments, the adhesion layer may be an adhesion layer as described above.

In various embodiments, the adhesion layer may be deposited using sputtering or chemical vapor deposition, e.g. atomic layer deposition. The adhesion layer may be deposited over the carrier, for example directly on the carrier, or for example on another layer, e.g. a barrier layer, formed directly on or over the carrier.

In various embodiments, the method of forming a semiconductor device may include depositing a metal layer over the adhesion layer using an electrolyte, wherein the electrolyte may include an additive and a water soluble metal salt, and wherein the additive may be configured to decompose or evaporate at a temperature above approximately 100° C. (in 411). The metal layer may be deposited over, e.g. directly on or indirectly on, the adhesion layer, for example as described above. In a case of the metal layer being formed indirectly on the adhesion layer, a seed layer may for example be formed between the adhesion layer and the metal layer.

In various embodiments, the method of forming a semiconductor device may include annealing the metal layer to form a metal layer including a plurality of pores (in 421). The annealing may be performed as described above. The annealing may for example be performed at a temperature that may be sufficient for forming an intermetallic phase, for example an alloy at the interface between at least a portion of the adhesion layer and at least a portion of the metal layer, for example at a temperature in a range from about 200° C. to about 500° C., for example around 400° C. Thus, a porous metal layer may be formed that at least partially, for example in a region, e.g. a layer, adjacent to the adhesion layer, may form an alloy of the material of the adhesion layer and the metal layer. Part of the adhesion layer material may also diffuse into the metal grains, e.g. Cu grains, or may decorate the Cu grain boundaries In various embodiments, the porous metal layer including the alloy region may have an increased elasticity over a large temperature range, for example up to a temperature of about 450° C., and a strong adhesion to the barrier layer.

In various embodiments, the adhesion layer may essentially completely or partially (completely) form an alloy with the metal layer at the interface between adhesion layer and the metal, e.g. the Cu. In that case, a thickness, i.e. a vertical extent, of the alloy layer may be limited by the thickness of the adhesion layer. In other words, the thickness of the alloy layer may be self-limiting. The thickness of the adhesion layer may, for example in that case, be small, for example smaller than about 20 nm or, for example, smaller than about 10 nm. This may have an advantage of keeping a degradation of an electrical and/or thermal conductivity of the metal layer by the alloy low.

More generally, as described above, the adhesion layer may have a thickness of up to about 1000 nm.

In various embodiments, the method of forming the semiconductor device may further include forming further layers, for example a barrier layer and/or a seed layer, for example as described above. The barrier layer may for example include a tungsten-titan-barrier, for example with a thickness of between about 50 nm and about 500 nm. The barrier layer may, in various embodiments, be formed over, e.g. on, the carrier, for example by deposition, e.g. by sputtering or chemical vapor deposition, e.g. atomic layer deposition. In various embodiments, for the deposition of the barrier layer, the same method may be used as for forming the adhesion layer. The same device may for example be used for forming the barrier layer and the adhesion layer. The seed layer may for example include or consist of the metal of the metal layer, for example of copper in the case of the metal layer including or consisting of copper. The seed layer may facilitate a deposition of the metal layer by providing seed particles for the galvanic deposition of the metal layer. The seed layer may have a thickness in a range from about 50 nm to about 500 nm, for example from about 100 nm to about 400 nm. The seed layer may, in various embodiments, be formed over, e.g. on, the adhesion layer, for example by deposition, e.g. by sputtering or chemical vapor deposition, e.g. atomic layer deposition. In various embodiments, for the deposition of the seed layer, the same method may be used as for forming the adhesion layer and/or the barrier layer. The same device may for example be used for forming the barrier layer, the adhesion layer and/or the seed layer.

Figure 3A:
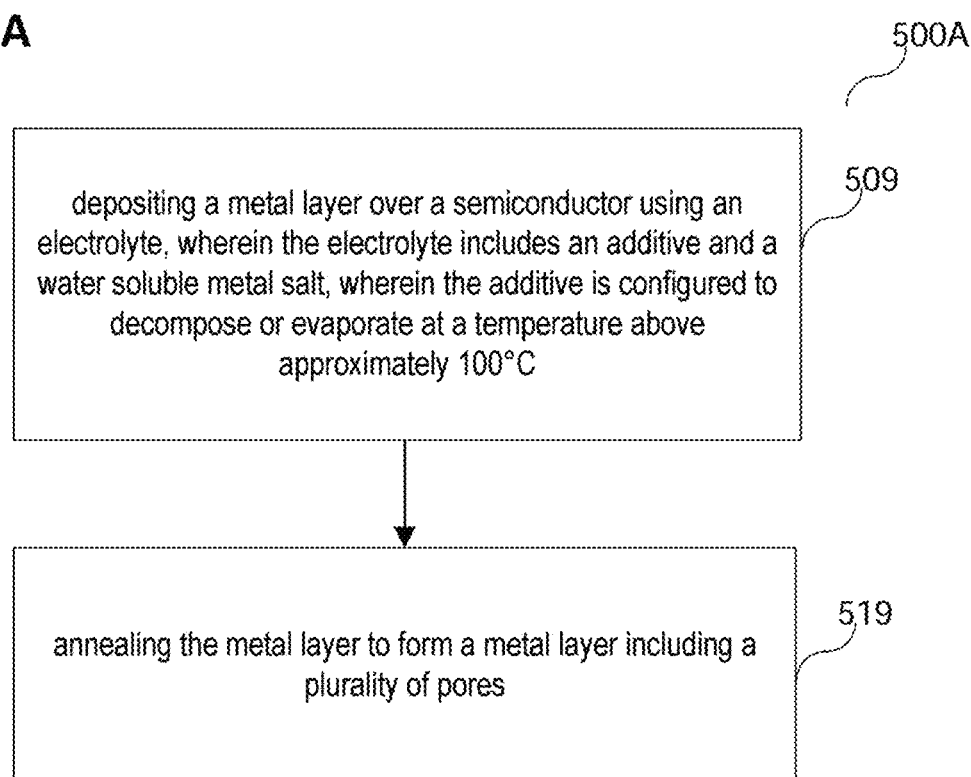
FIG. 3A and FIG. 3B show process flows of methods of forming a chip in accordance with various embodiments FIGS. 4A and 4B each show a focused ion beam cut image of a copper layer formed using an electrolyte and/or a method of forming a copper layer according to various embodiments before (in FIG. 4A) and after (in FIG. 4B) an annealing of the copper layer leading to a formation of pores.

FIG. 3A shows a process flow 500A of a method of forming a chip in accordance with various embodiments.

In various embodiments, the method of forming a chip may include depositing a metal layer over a semiconductor using an electrolyte, wherein the electrolyte may include an additive and a water soluble metal salt, wherein the additive may be configured to decompose or evaporate at a temperature above approximately 100° C. (in 509).

The electrolyte may be an electrolyte as described above.

The depositing of the metal layer may be performed as described above, for example by electrodeposition of the metal layer.

The metal layer may be deposited over the semiconductor.

In various embodiments, the semiconductor may be any semiconductor that may be suitable for forming a chip. The semiconductor may for example include or consist of a semiconductor material, for example at least one semiconductor material from a group of semiconductor materials, the group consisting of silicon, silicon-carbide, gallium-nitride, germanium, gallium arsenide, indium antimonide, zinc selenide, and cadmium sulfide, or any other from the group of III-V or II-VI compound semiconductors. In and/or on the semiconductor, at least one integrated circuit may be formed.

The metal layer may be formed directly on the semiconductor. Alternatively, at least one additional layer may be formed on the semiconductor. The at least one additional layer, may be an additional layer as described above for the additional layer of the carrier 334, e.g. a barrier layer and/or an adhesion layer and/or a seed layer, and the metal layer may be formed on the additional layer (on the topmost layer in a case of the at least one additional layer including a plurality of additional layers).

The method of forming the chip may further include annealing the metal layer to form a metal layer including a plurality of pores (in 519).

The annealing of the metal layer may be performed as described above.

Figure 3B:
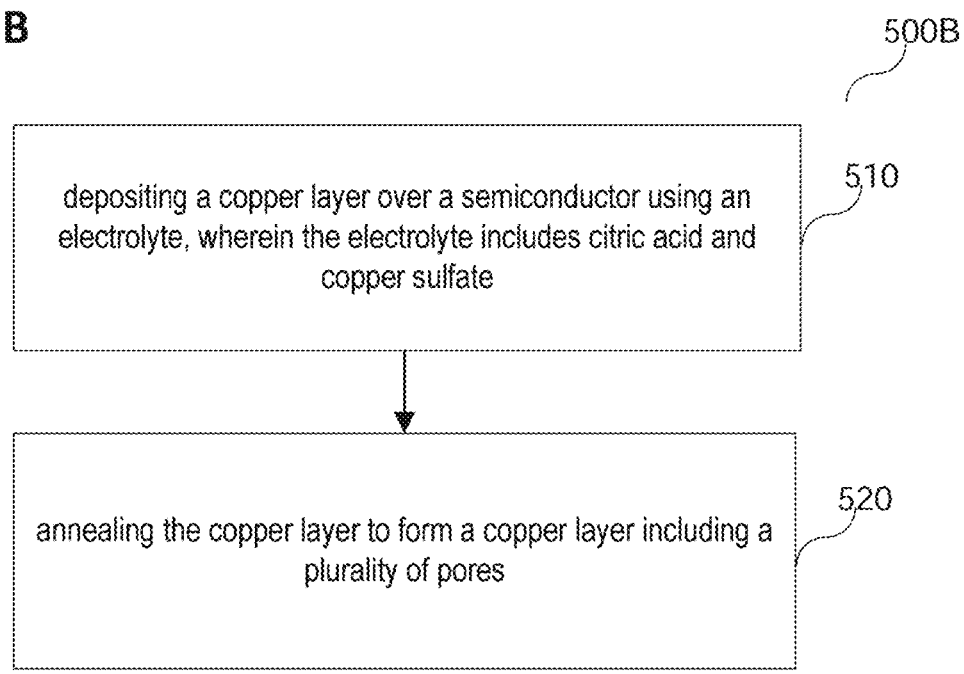

FIG. 3B shows a process flow 500 of a method of forming a chip in accordance with various embodiments.

In various embodiments, the method of forming a chip may include depositing a copper layer over a semiconductor using an electrolyte, wherein the electrolyte includes citric acid and copper sulfate (in 510).

The electrolyte may be an electrolyte as described in context with FIG. 2 for the method of forming a copper layer.

The depositing of the copper layer may be performed as described above, for example by electrodeposition of the copper layer.

The copper layer may be deposited on the semiconductor.

In various embodiments, the semiconductor may be any semiconductor that may be suitable for forming a chip. The semiconductor may for example include or consist of a semiconductor material, for example at least one semiconductor material from a group of semiconductor materials, the group consisting of silicon, silicon-carbide, gallium-nitride, germanium, gallium arsenide, indium antimonide, zinc selenide, and cadmium sulfide, or any other from the group of III-V or II-VI compound semiconductors. In and/or on the semiconductor, at least one integrated circuit may be formed.

The copper layer may be formed directly on the semiconductor. Alternatively, at least one additional layer may be formed on the semiconductor. The at least one additional layer may be an additional layer as described in context with FIG. 1 for the additional layer of the carrier 334, and the copper layer may be formed on the additional layer.

The method of forming the chip may further include annealing the copper layer to form a copper layer including a plurality of pores (in 520).

The annealing of the copper layer may be performed as described in context with FIG. 2B.

Figure 4A:
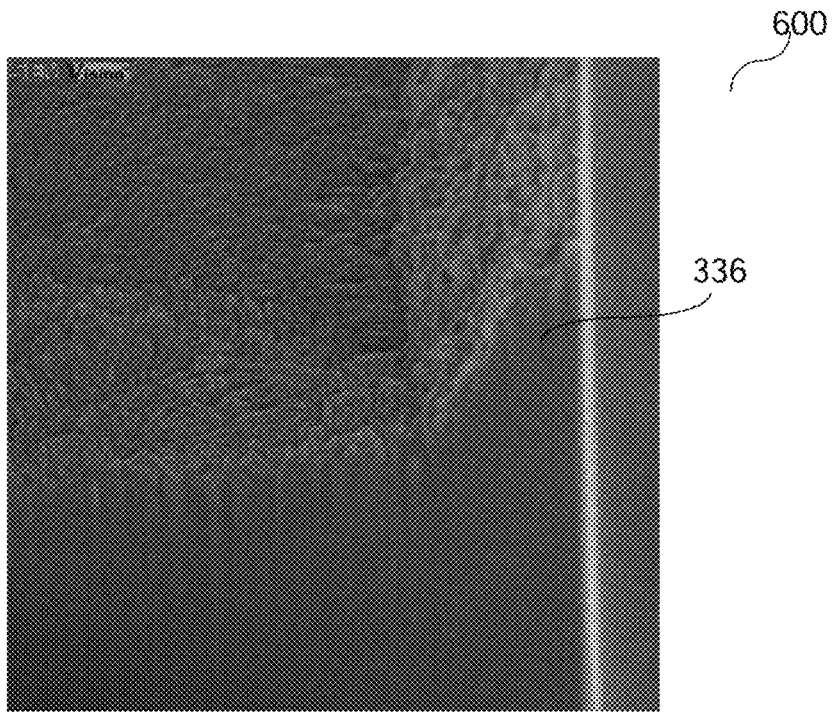
Figure 4B:
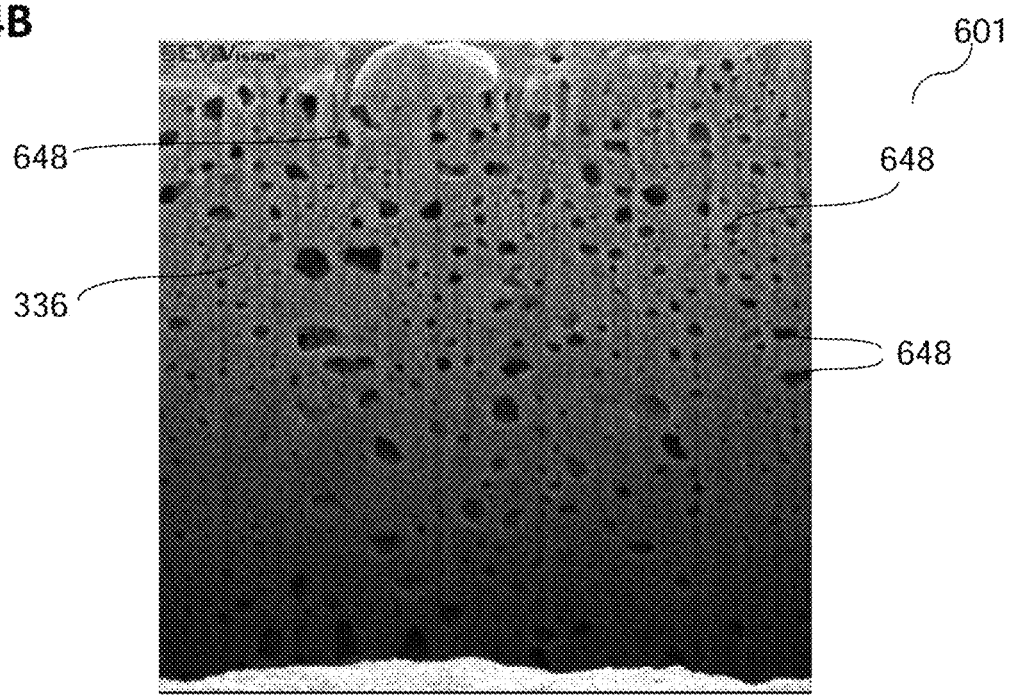

Using the method of forming a chip according to various embodiments, a chip with a copper layer, e.g. a thick copper layer, with a plurality of pores in the copper layer may be formed. Using the method of forming a copper layer according to various embodiments, a copper layer, e.g. a copper layer with a thickness of below 20 μm or a thick copper layer, e.g. with a thickness of about 20 μm or more, and with a plurality of pores in the copper layer may be formed. FIG. 4A and FIG. 4B each show a focused ion beam cut image 600 and 601, respectively, of a copper layer formed using an electrolyte and/or a method of forming a copper layer according to various embodiments before (in FIG. 4A) and after (in FIG. 4B) an annealing of the copper layer leading to a formation of pores.

The focused ion beam cut image 600 of FIG. 4A may show a cross section of the copper layer, e.g. of a copper layer 336 as described as the metal layer 336, which may be a copper layer, in context with FIG. 1.

The copper layer 336 in FIG. 4A is not annealed. Consequently, no pores are visible in the copper layer 336 of FIG. 4A.

In FIG. 4B, a cross section of a copper layer, e.g. the copper layer 336 of FIG. 4A or a different copper layer 336 deposited in accordance with various embodiments, for example as described above, may be shown after an annealing of the copper layer 336.

The annealing may have been performed as described above in context with FIG. 1 and/or FIG. 2.

A plurality of pores 648 may have formed in the copper layer 336 during the annealing. The plurality of pores 648 may be distributed over at least the whole part of the cross section visible in the image 601.

Figure 5:
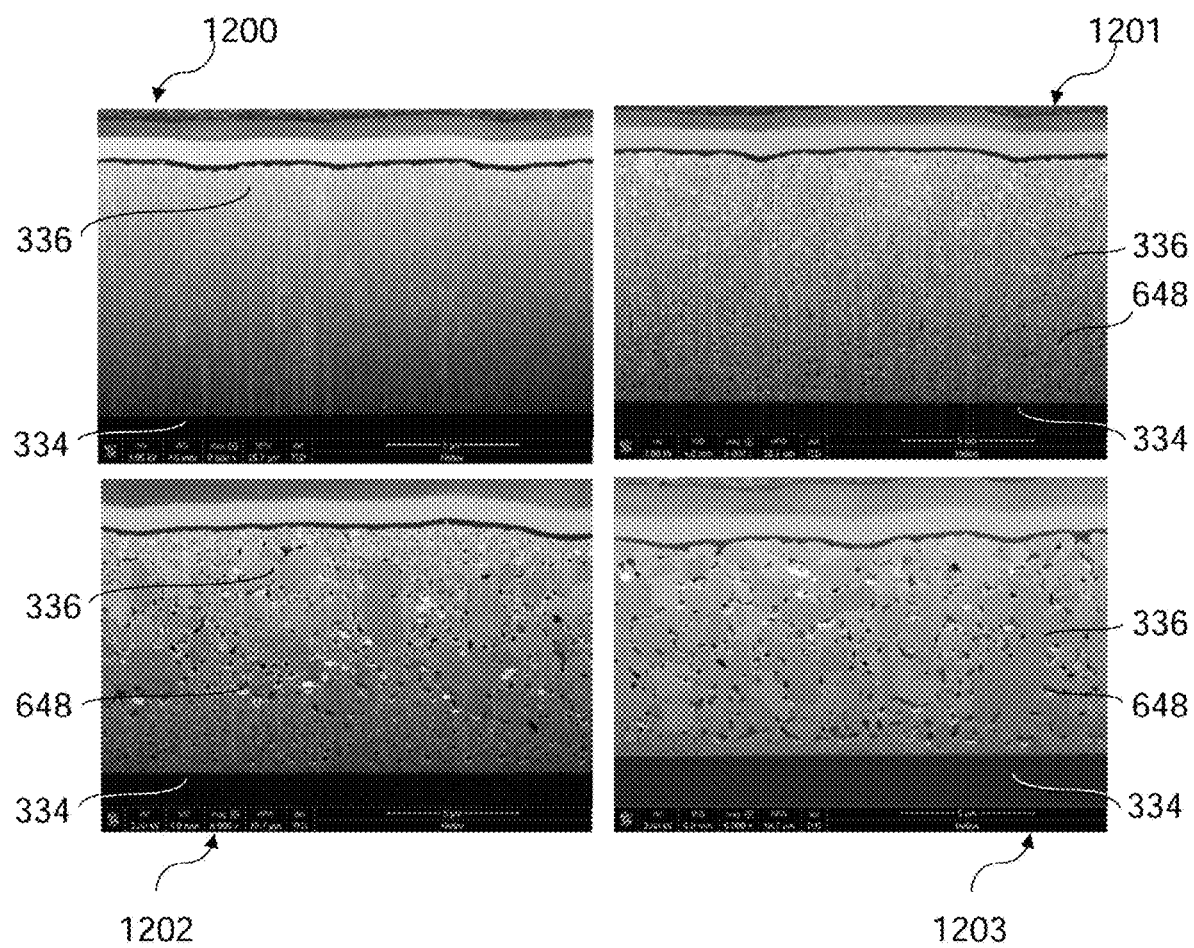
FIG. 5 shows a plurality of focused ion beam cut images, showing one comparison example and three copper layers formed using an electrolyte and/or a method of forming a copper layer according to various embodiments, wherein one or more parameters of an annealing process have been varied.

FIG. 5 shows a plurality of focused ion beam cut images 1200, 1201, 1202 and 1203, showing one comparison example 1200 and three copper layers 336 formed using an electrolyte and/or a method of forming a copper layer 336 according to various embodiments Each of the copper layers 336 may have been deposited on a silicon substrate using an electrolyte including copper sulfate, citric acid, and ammonium sulfate. Subsequently, the copper layers 336 may have been annealed. A temperature of the copper layer may have been increased to an annealing temperature by applying a temperature gradient, i.e. a temperature increase per unit time, and the temperature of the copper layer may have been kept at the annealing temperature or (slightly) above for an annealing duration as summarized in the table below. The annealing may have been conducted in formic acid vapor.

| Image | Temperature gradient | Annealing temperature | Annealing duration |
|---|---|---|---|
| 1200 | 2.3° C./sec | 150° C. | 15 min |
| 1201 | 2.3° C./sec | 200° C. | 15 min |
| 1202 | 2.3° C./sec | 250° C. | 15 min |
| 1203 | 0.2° C./sec | 400° C. | 15 min |

As may be seen from FIG. 5, a formation of a plurality of pores, e.g. pores 648 as described above, may depend on the annealing temperature. For example, the copper layer 336 of image 1200, which was annealed with an annealing temperature of 150° C., may not show pores. It may thus be considered as a comparative example to the examples of various embodiments shown in images 1201, 1202 and 1203. Within the parameter set explored in the experiments, the formation of pores sets in at an annealing temperature of 200° C., depicted in image 1201.

A size and/or a density of the plurality of pores may increase with annealing temperature. For example, there may be larger pores 648 and/or more pores 648 in the copper layer 336 (annealed at a temperature of 250° C.) depicted in image 1202 than in the copper layer of image 1201. In the copper layer 336 of image 1203, the size of the pores 648 may be larger still, and their density, e.g. their number density or the volume occupied by the pores, may have increased.

This may indicate that a minimum temperature, for example the temperature required for decomposing the citric acid and/or the citrate complexes, respectively, may have to be reached in order to form the plurality of pores 648 in the copper layer 336. From the experiment, the minimum annealing temperature may be estimated to lie between about 150° C. (no pores formed) and 200° C. (pores formed). In various embodiments, for example as described above, with the additive consisting of or including an additive as described above and different from citric acid, the minimum annealing temperature for forming the pores may more generally lie above about 100° C., e.g. between about 100° C. and 600° C., e.g. between about 130° C. and 400° C., and also parameters like pore size, concentration etc. may have a dependency on temperature that may be different from that of citric acid, and thus be adjusted according to requirements.

Figure 6:
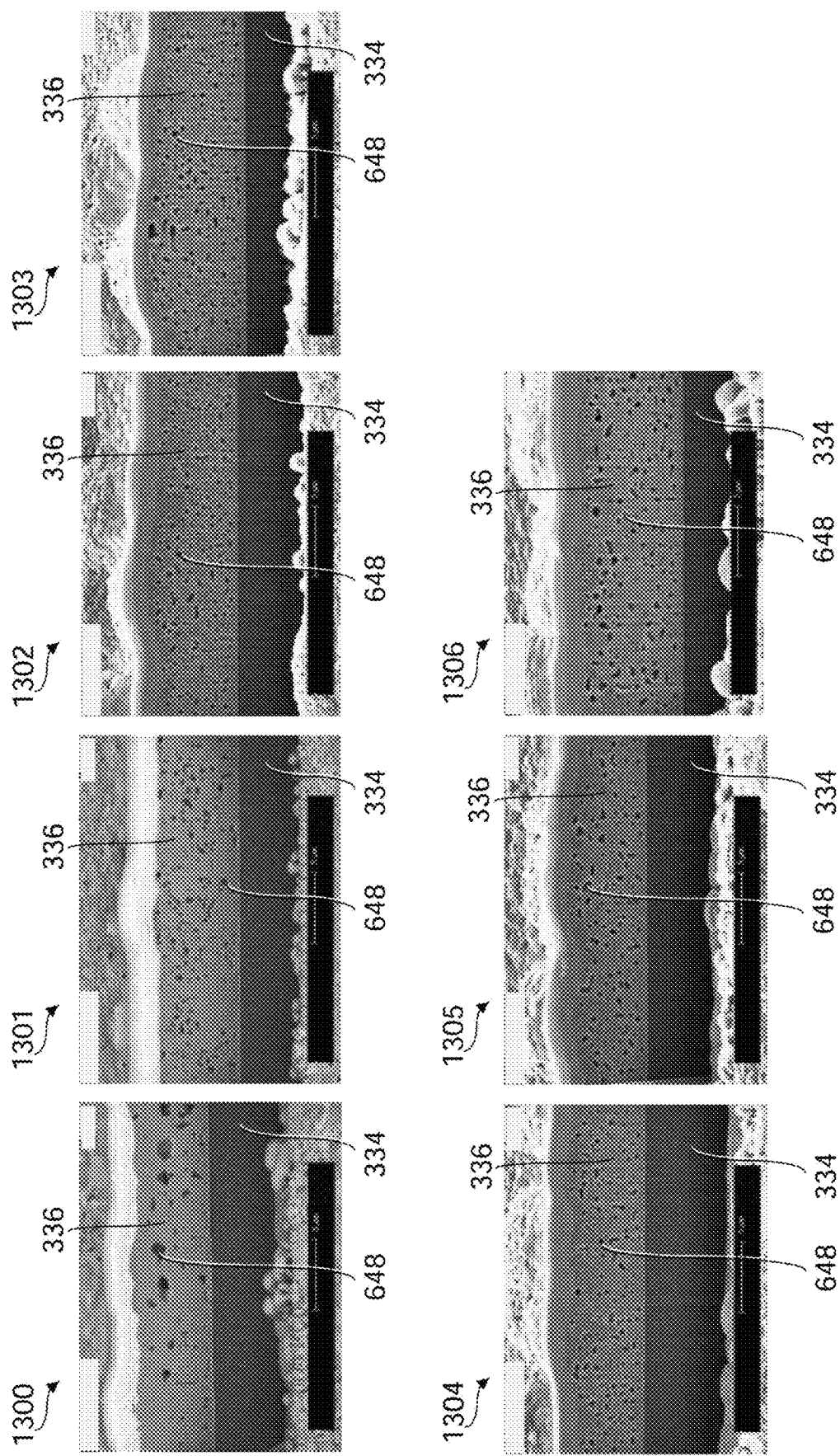
FIG. 6 shows a plurality of focused ion beam cut images, each showing a copper layer formed using an electrolyte and/or a method of forming a copper layer according to various embodiments, wherein an additive concentration has been varied.

FIG. 6 shows, as a result of experimental tests, a plurality of focused ion beam cut images 1300, 1301, 1302, 1303, 1304, 1305, and 1306, each showing one of a plurality of copper layers 336 formed using an electrolyte according to various embodiments. Each of the copper layers 336 may be formed on a carrier 334. A magnification may be about 5000.

The electrolyte used for forming the respective copper layers 336 shown in the images 1300 to 1306 may include 50 g/l of ammonium sulfate, 100 g/l of copper sulfate pentahydrate as the water soluble metal salt of the electrolyte as described above, and a concentration of an additive with properties as described above as follows (respective images in parentheses): 0.1 g/l (image 1300), 1 g/l (image 1301), 2.5 g/l (image 1302), 4 g/l (image 1303), 5 g/l (image 1304), 6 g/l (image 1305) and 10 g/l (image 1306). The pH value of the electrolyte was adjusted to 2.25. A current density provided to electrodes of a device used for a deposition of the copper layers, e.g. the device 300 of FIG. 1, for example a current density provided by the power source 344 of FIG. 1, may be 3 A dm$^{-2}$. Each of the copper layers 336 may have been annealed with an annealing temperature of 400° C. for a duration of 30 minutes. As may be seen from FIG. 6, the plurality of pores may be formed in the copper layer for a concentration of additive in a range from about 0.1 g/l to about 10 g/l. At a low end of the cited range of the additive concentrations, e.g. around 0.1 g/l or around 1 g/l, a size of the pores 648, e.g. an average or a median size, may be larger than at the higher additive concentrations.

FIG. 7 shows a plurality of focused ion beam cut images 1400, 1401, 1402, 1403, 1404 and 1405, each showing one of a plurality of copper layers 336 formed using an electrolyte and/or a method of forming a copper layer 336 according to various embodiments, for example in context with FIG. 1 to FIG. 6.

The electrolyte used for forming the respective copper layers 336 shown in the images 1400 to 1405 may include 50 g/l of ammonium sulfate, 100 g/l of copper sulfate pentahydrate and 2.5 g/l of an additive as described above. A pH value of the electrolyte was adjusted, e.g. as described above. A current density provided to electrodes of a device used for a deposition of the copper layers, e.g. the device 300 of FIG. 3, for example a current density provided by the power source 344 of FIG. 3, was varied. The pH values and current densities used for forming the copper layers in the images 1400 to 1405 were as follows: pH 1.9, 1 A dm$^{-2}$ (image 1400), pH 2.25, 1 A dm$^{-2}$ (image 1401), pH 2.5, 1 A dm$^{-2}$ (image 1402), pH 1.9, 3 A dm$^{-2}$ (image 1403), pH 2.25, 3 A dm$^{-2}$ (image 1404), pH 2.5, 3 A dm$^{-2}$ (image 1405). Each of the copper layers 336 may have been annealed with an annealing temperature of 400° C. for a duration of 30 minutes.

In various embodiments, as shown in FIG. 7, the plurality of pores may be formed in the copper layer for a pH value in a range from about 1.9 to about 2.5 and for a current density applied during the forming of the copper layer of 1 A dm$^{-2}$ and of 3 A dm$^{-2}$. The pores in the copper layer 336 formed with the higher current density of 3 A dm$^{-2}$ may show a more homogeneous spatial distribution than the pores in the copper layer 336 formed with the lower current density of 1 A dm$^{-2}$ FIG. 8A shows a focused ion beam cut image 1500 of a conventional copper layer 104, and a graph 1500b showing a relation of stress as a function of temperature during a thermal cycling of the conventional copper layer 104.

The copper layer 104 of FIG. 8A may have been formed e.g. by electrodeposition, e.g. with a common electrolyte. It may have a large size of its crystallites (the crystallites may not coincide with areas of uniform shading in the image 1500), and it may not have pores. The copper layer 104 may have a thickness of about 11 µm. It may be formed on a semiconductor carrier 334, e.g. on a silicon carrier 334.

A thermal behaviour of the copper layer 104, in other words a reaction of the copper layer 104 to thermal cycling, may be parameterized as a graphic relation (as shown in graph 1500b of FIG. 8A) of temperature (in ° C. on the horizontal axis) and stress (in arbitrary units in the vertical axis, wherein positive values may correspond to tensile stress and negative values may correspond to compressive stress). Thermal cycling may mean that a temperature of the copper layer 104 is repeatedly raised and lowered. For example, the temperature of the copper layer may be increased, e.g. from about 20° C. to about 400° C. (heating1). Thereafter, the temperature of the copper layer 104 may be lowered, e.g. to about 30° C. (cooling1). Subsequently, the temperature may be increased again, e.g. again up to 400° C. (heating2). Then, the temperature may be lowered again, e.g. to about 50° C. (cooling2), and raised again to about 400° C. (heating3). A third cooling (cooling3) may bring the temperature of the copper layer down to about 50° C.

The thermal behaviour of the copper layer 104 may show a hysteresis, in other words, the copper layer may not always show the same amount of stress at the same temperature. Rather, a level of stress present in the copper layer 104 may depend on what process the copper layer 104 has been subjected to before. For example, a stress level during a first heating may generally be lower than during a subsequent heating, and the stress level during the cooling phases may be higher than for the same temperature during any of the heating phases.

The large and variable amounts of stress present in the copper layer 104 may lead to a degradation of the copper layer 104 and/or its interface to the carrier 334. A measure for a mechanical stress induced by the thermal cycling may be a size of an area enclosed by the lines in the graph 1500b representing the stress as a function of temperature for the heating phases and for the cooling phases (the size of the area may be a measure for work, e.g. thermomechanical work, to be done by the copper layer 104).

FIG. 8B shows a focused ion beam cut image 1501 of a copper layer 336 formed in accordance with an embodiment, e.g. as described above, and a graph 1501b showing a relation of stress as a function of temperature during a thermal cycling of the copper layer 336.

The copper layer 336 of FIG. 8B may have been formed e.g. by electrodeposition, e.g. using the electrolyte according to various embodiments, and annealing the copper layer 336, thereby forming a plurality of pores 648 in the copper layer 336. It may have a small size of its crystallites (the crystallites may not coincide with areas of uniform shading in the image 1501). The copper layer 336 may have a thickness of about 11 µm. It may be formed on a carrier 334, e.g. on a carrier 334 as described above, e.g. on a carrier 334 including silicon and an additional layer, e.g. a barrier layer, of tungsten titanium (WTi). The additional layer of tungsten titanium may have a thickness of about 300 nm.

A thermal behaviour of the copper layer 336, analogous to graph 1500b of FIG. 8A, is shown in graph 1501b of FIG. 8B. Temperature end points of the thermal cycles are the same as described above for the thermal cycling of the conventional copper layer 104.

The thermal behaviour of the copper layer 336 may show a much lower amplitude of the stress values and essentially no hysteresis. The area formed between heating- and the cooling branches of the graph is very small, its size may only be a small fraction of the size of the area in FIG. 8A. Due to the lower stress amplitude and the smaller amount of work to be done by the copper layer 336 as compared to the conventional copper layer 104 during thermal cycling, a robustness of the copper layer 336 subjected to temperature variations may be increased as compared to the conventional copper layer 104.

FIG. 8C shows a focused ion beam cut image 1502 of a copper layer 336 formed in accordance with an embodiment, e.g. as described above, and a graph 1501b showing a relation of stress as a function of temperature during a thermal cycling of the copper layer 336.

Before the forming of the copper layer 336, an adhesion layer 1504 may have been formed over the carrier 334, and a barrier layer as described in FIG. 8B (i.e., a 300 nm WTi layer) may be arranged between the carrier 334 and the adhesion layer 1504. The adhesion layer 1504 may be an aluminum layer with a thickness of 100 nm. It may have been formed as described above in accordance with various embodiments. The copper layer 336 of FIG. 8C may have been formed e.g. by electrodeposition onto the adhesion layer 1504, e.g. using the electrolyte according to various embodiments, and annealing the copper layer 336, thereby forming a plurality of pores 648 in the copper layer 336. The annealing temperature may have been sufficiently high for forming an alloy between at least a fraction of the adhesion layer 1504 and a fraction of the copper layer 336. The copper layer 336 may have a small size of its crystallites (the crystallites may not coincide with areas of uniform shading in the image 1502). The copper layer 336 may have a thickness of about 11 µm.

A thermal behaviour of the copper layer 336, analogous to graph 1500b of FIG. 8A, is shown in graph 1502b of FIG. 8C. Temperature end points of the thermal cycles are the same as described above for the thermal cycling of the conventional copper layer 104.

The thermal behaviour of the copper layer 336 as compared with the conventional copper layer 104 may show a lower amplitude of the stress values (in particular the negative values) and essentially no hysteresis. The area formed between heating- and the cooling branches of the graph is very small, its size may only be a small fraction of the size of the area in FIG. 8A. Due to the lower stress amplitude and the smaller amount of work to be done by the copper layer 336 as compared to the conventional copper layer 104 during thermal cycling, a robustness of the copper layer 336 subjected to temperature variations may be increased as compared to the conventional copper layer 104. Furthermore, an adhesion of the copper layer 336 to the carrier 334 may be improved by the adhesion layer 1504, while maintaining the improved robustness of the copper layer 336 to the thermal cycling.

In various embodiments, an electrolyte is provided. The electrolyte may include at least one additive configured to decompose or evaporate at a temperature above approximately 100° C., and copper sulfate. The electrolyte may be free from carbon nanotubes.

In various embodiments, an electrolyte is provided. The electrolyte may include at least one additive configured to decompose or evaporate at a temperature above approximately 100° C., and a water soluble metal salt. The electrolyte may be free from carbon nanotubes.

In various embodiments, the additive may include an organic molecule.

In various embodiments, the organic molecule may include carboxylic acid.

In various embodiments, the electrolyte may further include ammonium sulfate.

In various embodiments, the additive may satisfy the formula $(CRR'R''R''')_n$, wherein n may be larger or equal to 1 and smaller than or equal to 20,000, and wherein the attachments R, R', R'', and R''' may be defined individually for each C-atom from the following group of attachments:

COOQ, C(O)X, C(O)Q, C(O)NQ, CN, COQ, SQ, H, NQQ', SOO(OQ), C(O)OOQ, O, OH, wherein Q=(CRR'R"R''')$_m$ or H, and X=F, Cl, Br.

In various embodiments, the additive may have a concentration in a range from about 0.05 g/l to about 30 g/l.

In various embodiments, a ratio of ammonium sulfate over the additive may be 10.

In various embodiments, the electrolyte may have a pH value in a range from about 1.0 to about 2.7.

In various embodiments, a ratio of the water soluble metal salt over the additive may be 20.

In various embodiments, the water soluble metal salt may have a concentration in a range from about 50 g/l to about 150 g/l.

In various embodiments, the water soluble metal salt may include or consist of a sulfate, a nitrate or a cyanide.

In various embodiments, the water soluble metal salt may include copper sulfate.

In various embodiments, the water soluble metal salt may include or consist of copper sulfate pentahydrate In various embodiments, the copper sulfate pentahydrate may have a concentration in a range from about 50 g/l to about 150 g/l.

In various embodiments, a ratio of copper sulfate over the additive may be 20.

In various embodiments, an electrolyte is provided. The electrolyte may include citric acid and copper sulfate. The electrolyte may be free from carbon nanotubes.

In various embodiments, the electrolyte may further include ammonium sulfate.

In various embodiments, the citric acid may have a concentration in a range from about 0.05 g/l to about 30 g/l.

In various embodiments, a ratio of ammonium sulfate over citric acid may be 10.

In various embodiments, a ratio of copper sulfate over citric acid may be 20.

In various embodiments, the electrolyte may further include at least one of another acid or a base.

In various embodiments, the electrolyte including the citric acid may have a pH value in a range from about 1.3 to about 2.7.

In various embodiments, the electrolyte may be free from carbon allotropes.

In various embodiments, the ammonium sulfate may have a concentration in a range from about 20 g/l to about 80 g/l.

In various embodiments, the copper sulfate pentahydrate may have a concentration in a range from about 50 g/l to about 150 g/l.

In various embodiments, a method of forming a metal layer is provided. The method may include depositing a metal layer over a carrier using an electrolyte, wherein the electrolyte includes an additive and a water soluble metal salt, wherein the electrolyte may be free from carbon nanotubes, and wherein the additive may be configured to decompose or evaporate at a temperature above approximately 100° C.; and annealing the metal layer to form a metal layer including a plurality of pores.

In various embodiments, the metal of the metal layer and of the metal salt may include or consist of at least one metal of a group of metals consisting of copper (Cu), gold (Au), silver (Ag), platinum (Pt), palladium (Pd), nickel (Ni), and tin (Sn).

In various embodiments, the annealing may include heating the metal layer to a temperature above about 150° C.

In various embodiments, a method of forming a copper layer is provided. The method may include depositing a copper layer over a carrier using an electrolyte. The electrolyte may include an additive and copper sulfate. The electrolyte may be free from carbon nanotubes, and the additive may be configured to decompose or evaporate at a temperature above approximately 100° C. The method may further include annealing the copper layer to form a copper layer including a plurality of pores.

In various embodiments, the additive may include an organic molecule.

In various embodiments, a method of forming a copper layer may be provided. The method may include depositing a copper layer on a carrier using an electrolyte, wherein the electrolyte may include citric acid and copper sulfate, wherein the electrolyte may be free from carbon nanotubes. The method may further include annealing the copper layer to form a copper layer including a plurality of pores.

In various embodiments, the electrolyte may further include ammonium sulfate.

In various embodiments, the method may further include adjusting a pH value of the electrolyte to be in the range from about 1.5 to about 2.7.

In various embodiments, the annealing may include heating the copper layer to a temperature above about 200° C.

In various embodiments, the method may further include forming a patterned mask on the carrier.

In various embodiments, the carrier may include or consist of a semiconductor.

In various embodiments, a method of forming a chip is provided. The method may include depositing a metal layer over a semiconductor using an electrolyte, wherein the electrolyte may include an additive and a water soluble metal salt, wherein the additive may be configured to decompose or evaporate at a temperature above approximately 100° C.; and annealing the metal layer to form a metal layer having a plurality of pores.

In various embodiments, a method of forming a chip is provided. The method may include depositing a copper layer over a semiconductor using an electrolyte, wherein the electrolyte may include an additive and copper sulfate, wherein the additive may be configured to decompose or evaporate at a temperature above approximately 100° C. The method may further include annealing the copper layer to form a copper layer comprising a plurality of pores.

In various embodiments, a method of forming a chip may be provided. The method may include depositing a copper layer over a semiconductor using an electrolyte, wherein the electrolyte may include citric acid and copper sulfate; and annealing the copper layer to form a copper layer including a plurality of pores.

In various embodiments, a method of forming a semiconductor device is provided. The method may include forming an adhesion layer over a carrier; depositing a metal layer over the adhesion layer using an electrolyte, wherein the electrolyte may include an additive and a water soluble metal salt, and wherein the additive may be configured to decompose or evaporate at a temperature above approximately 100° C.; and annealing the metal layer to form a metal layer having a plurality of pores and doping atoms out of the adhesion layer.

In various embodiments, the adhesion layer may be a metallic adhesion layer. The doping atoms may be doping metal atoms.

In various embodiments, the metal of the metal layer may be different from the metal of the adhesion layer.

In various embodiments, the method may further include depositing a seed layer on the metallic adhesion layer before depositing the metal layer.

In various embodiments, a method of forming a semiconductor device is provided. The method may include forming an adhesion layer over a carrier; depositing a copper layer over the adhesion layer using an electrolyte, wherein the electrolyte may include an additive and copper sulfate, and wherein the additive may be configured to decompose or evaporate at a temperature above approximately 100° C.; and annealing the copper layer to form a copper layer including a plurality of pores. The copper layer may further include doping atoms out of the adhesion layer.

In various embodiments, the metal of the adhesion layer may be different from copper.

In various embodiments, the method may further include depositing a seed layer on the metallic adhesion layer before depositing the copper layer.

In various embodiments, a semiconductor device is provided. The semiconductor device may include a metal layer including a plurality of pores, wherein the plurality of pores may be formed in the metal layer as remnants of an additive having resided in the plurality of pores and having at least partially decomposed or evaporated.

In various embodiments, the semiconductor device may further include a carrier, and an adhesion layer arranged between the carrier and the metal layer.

In various embodiments, the semiconductor device may further include an alloy region between the metal layer and the adhesion layer, wherein the alloy region may include an alloy of the metal of the adhesion layer and the metal of the metal layer.

In various embodiments, the semiconductor device may further include a carrier, and an adhesion layer arranged between the carrier and the metal layer.

In various embodiments, the semiconductor device may further include an alloy region between the metal layer and the adhesion layer, wherein the alloy region may include an alloy of the metal of the adhesion layer and the metal of the metal layer.

In various embodiments, the metal layer may be a structured metal layer.

In various embodiments, a semiconductor device is provided. The semiconductor device may include a copper layer including a plurality of pores, wherein the plurality of pores may be formed in the copper layer as remnants of an additive having resided in the plurality of pores and having at least partially decomposed or evaporated.

In various embodiments, a volume density of the plurality of pores may be in a range from about 1% to about 50%.

In various embodiments, an average size of copper crystallites of the copper layer after an annealing of the copper layer may be in a range from about 10 nm to about 50 nm.

In various embodiments, the semiconductor device may further include a carrier, and an adhesion layer arranged between the carrier and the copper layer.

In various embodiments, the semiconductor device may further include an alloy region between the copper layer and the adhesion layer, wherein the alloy region may include an alloy of the metal of the adhesion layer and the copper of the copper layer.

In various embodiments, the adhesion layer may have a thickness in a range from 10 nm to 1000 nm.

In various embodiments, the copper layer may be a structured copper layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

What is claimed is:

1. A method of forming a metal layer, comprising:
depositing a metal layer over a carrier using an electrolyte, wherein the electrolyte comprises an additive and a water soluble metal salt, wherein the electrolyte is free from carbon nanotubes, wherein the electrolyte has a pH value in the range from 1.0 to 2.5, and wherein the additive is configured to decompose or evaporate at a temperature above approximately 100° C.; and
forming a plurality of pores in the deposited metal layer by annealing the deposited metal layer to form a continuous metal layer comprising the plurality of formed pores.

2. The method of claim 1,
wherein the metal of the metal layer and of the metal salt includes or consists of at least one metal of a group of metals consisting of copper (Cu), gold (Au), silver (Ag), platinum (Pt), palladium (Pd), nickel (Ni), and tin (Sn).

3. The method of claim 1,
wherein the annealing comprises heating the metal layer to a temperature above about 150° C.

4. The method of claim 1, further comprising:
forming a patterned mask on the carrier.

5. The method of claim 1,
wherein the carrier comprises semiconductor material.

6. A method of forming a semiconductor device, comprising:
forming an adhesion layer over a carrier;
depositing a metal layer over the adhesion layer using an electrolyte, wherein the electrolyte comprises an additive and a water soluble metal salt, and wherein the additive is configured to decompose or evaporate at a temperature above approximately 100° C., wherein the electrolyte is free from carbon nanotubes, and wherein the electrolyte has a pH value in the range from 1.0 to 2.7; and
forming a plurality of pores in the metal layer by annealing the metal layer to form a continuous metal layer comprising the plurality of formed pores and doping metal atoms out of the adhesion layer.

7. The method of claim 6, further comprising:
depositing a seed layer on the adhesion layer before depositing the metal layer.

8. The method of claim 1, wherein
a volume density of the plurality of pores is in a range from about 1% to about 50%.

9. The method of claim 1, comprising
depositing an adhesion layer over the carrier before depositing the metal layer.

10. The method of claim 9, wherein
the adhesion layer includes of one or more metal(s) of a group of metals consisting of aluminum, titanium, zinc, tin, nickel, silver, gold, molybdenum and lead.

11. The method of claim 5, wherein the carrier includes one or more components of a power semiconductor device.

12. The method of claim 11, wherein
the power semiconductor device includes a power diode, a thyristor, a power MOSFET, an IGBT, and/or a microelectromechanical system (MEMS).

13. The method of claim 1, wherein one or more of the plurality of pores are closed-pores.

14. The method of claim 1, wherein one or more of the plurality of pores are open-pores.

15. The method of claim 1, wherein one or more of the plurality of pores have a spheroidal or ellipsoidal shape.

16. The method of claim 1, wherein one or more of the plurality of pores have a concave and/or a convex wall structure.

17. The method of claim 1, wherein during the annealing, the additive decomposes to form one or more gaseous decomposition products, wherein the one or more decomposition products cause the formation of pores during the annealing.

18. The method of claim 17, wherein the one or more decomposition products comprise carbon dioxide, acetone, and/or acetic acid.

19. The method of claim 9, wherein the adhesion layer is formed directly on the carrier, the carrier comprising semiconductor material.

20. The method of claim 1, wherein the continuous metal layer comprising a bottom surface facing the carrier and an integral and continuous top surface opposite to the bottom surface.

* * * * *